(12) United States Patent
Kanaya et al.

(10) Patent No.: US 6,511,877 B2
(45) Date of Patent: Jan. 28, 2003

(54) SEMICONDUCTOR INTEGRATED CIRCUIT AND METHOD FOR MANUFACTURING THE SAME

(75) Inventors: Hiroyuki Kanaya, Yokohama (JP); Osamu Hidaka, Tokyo (JP); Kumi Okuwada, Kawasaki (JP); Hiroshi Mochizuki, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/922,074

(22) Filed: Aug. 6, 2001

(65) Prior Publication Data

US 2001/0051414 A1 Dec. 13, 2001

Related U.S. Application Data

(63) Continuation of application No. 09/095,890, filed on Jun. 11, 1998.

(30) Foreign Application Priority Data

Jul. 17, 1997 (JP) .............................................. 9-192168

(51) Int. Cl.[7] .......................................... H01L 21/8242
(52) U.S. Cl. ............................ 438/240; 438/3; 438/253; 438/396
(58) Field of Search ............................ 438/3, 239, 240, 438/155, 253, 396, 387, 386, 397

(56) References Cited

U.S. PATENT DOCUMENTS

| 5,227,855 | A | * | 7/1993 | Momose ..................... 257/295 |
| 5,717,234 | A |   | 2/1998 | Si et al. |
| 5,986,301 | A | * | 11/1999 | Fukushima et al. ......... 257/295 |
| 6,271,084 | B1 | * | 8/2001 | Tu et al. ..................... 438/240 |
| 6,284,586 | B1 | * | 9/2001 | Seliskar et al. ............. 438/239 |

FOREIGN PATENT DOCUMENTS

| JP | 8-139293 | 5/1996 |
| JP | 8-23079  | 1/1997 |
| JP | 9-135007 | 5/1997 |
| JP | 9-148537 | 6/1997 |

* cited by examiner

*Primary Examiner*—Mary Wilczewski
*Assistant Examiner*—Judith A. Cothorn
(74) *Attorney, Agent, or Firm*—Banner & Witcoff, Ltd.

(57) ABSTRACT

A semiconductor integrated circuit has a ferroelectric capacitor. The ferroelectric capacitor includes a first insulation film formed above a semiconductor substrate, a first electrode which is buried in a fist hole formed in the first insulation film and whose surface is flattened, a second insulation film formed above the first insulation film and having a second hole above the first electrode, a ferroelectric film formed in the second hole, and a second electrode formed in the second hole and above the ferroelectric film and flattened so as to be flush with a surface of the second insulation film.

5 Claims, 25 Drawing Sheets

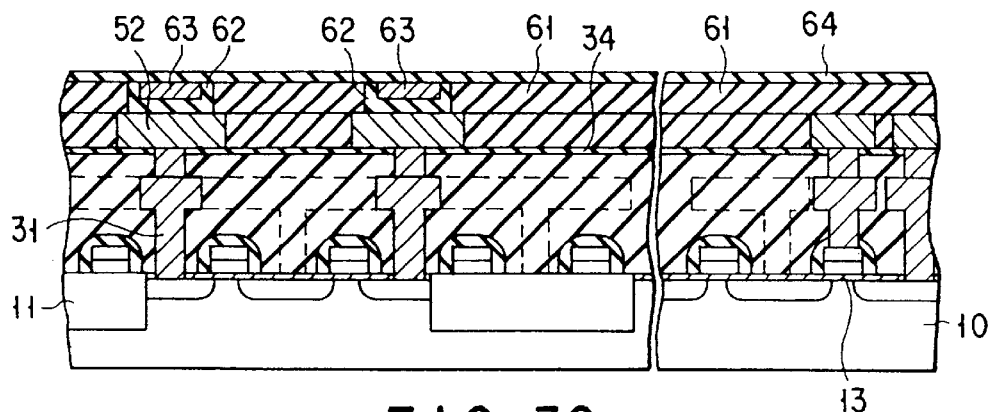
F I G. 36
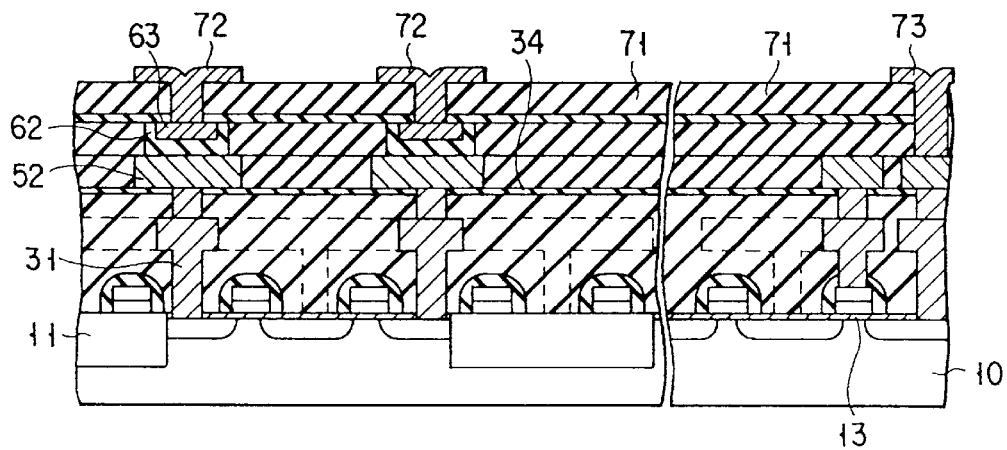
F I G. 37
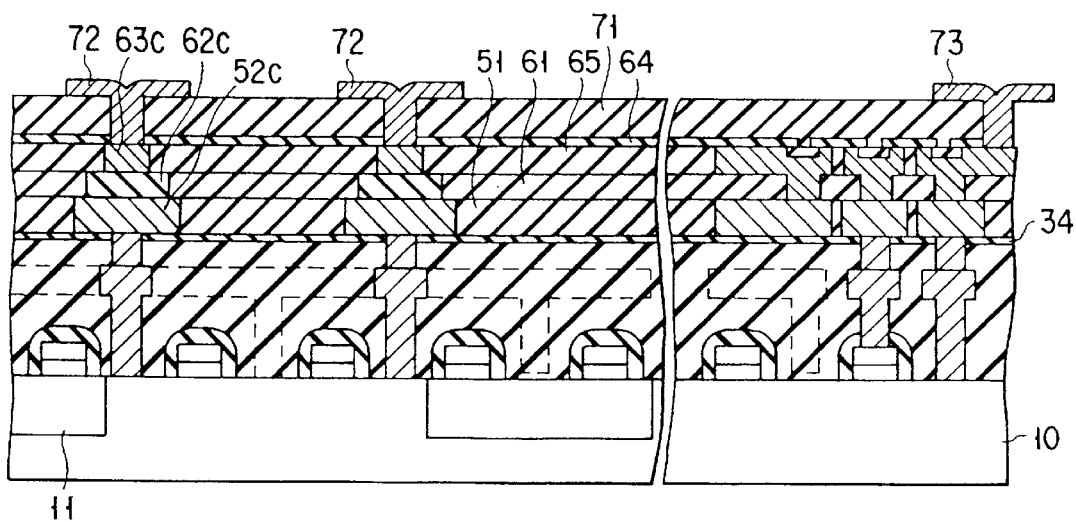
F I G. 38

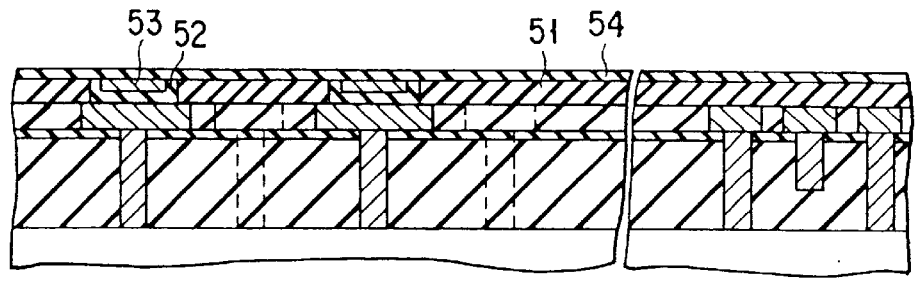
F I G. 42
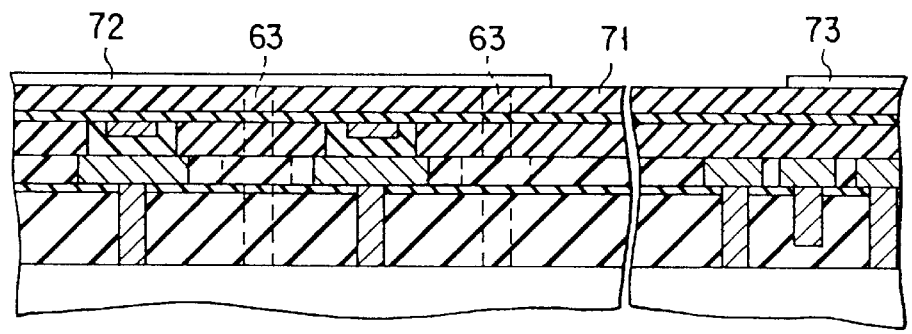
F I G. 43
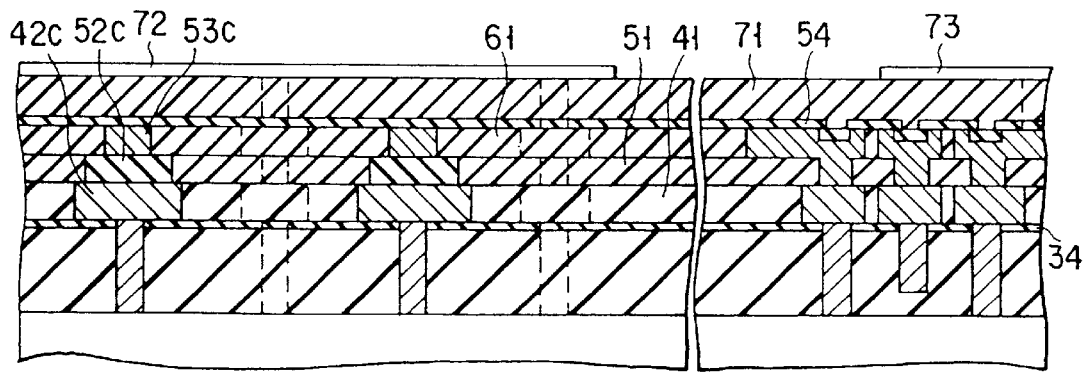
F I G. 44

SEMICONDUCTOR INTEGRATED CIRCUIT AND METHOD FOR MANUFACTURING THE SAME

This application is a continuation of U.S. patent application Ser. No. 09/095,890, filed Jun. 11, 1998 which claims priority under 35 U.S.C. §119 to Japanese patent application No. 9-192168, filed Jul. 17, 1997. The entire disclosures of the prior applications are hereby incorporated by reference herein.

BACKGROUND OF THE INVENTION

The present invention relates to a semiconductor integrated circuit and a method for manufacturing the same and, more particularly, to a large scale integrated circuit (LSI) including a nonvolatile ferroelectric random access memory cell (FRAM cell) having an array of nonvolatile ferroelectric random access memory (FRAM) cells using a ferroelectric film as a capacitor insulation film and a method for manufacturing the same.

An FRAM cell is constituted by replacing a capacitor of DRAM cell with a ferroelectric capacitor and operated using a method of taking charges in polarization inversion or noninversion out of the ferroelectric capacitor through a switching MOS transistor (data destructive read). The FRAM cell is featured in that data stored in a memory cell is not lost even when an operating power is turned off.

As compared with a DRAM representing a large capacity memory, the FRAM has the feature of dispensing with both a refresh operation for data retention and power consumption in a standby mode since it is nonvolatile. As compared with a flash memory of another nonvolatile memory, the FRAM has the feature of increasing the number of times of data rewriting and in that a data rewrite speed is fast. Moreover, as compared with an SRAM used for a memory card and the like and requiring the backup of a battery, the FRAM has the feature of decreasing power consumption and greatly reducing cell area.

Since the FRAM having the above features can be operated at high speed without any battery, it is going to be applied to a noncontact card such as RF-ID (Radio Frequency-Identification). There is a great hope that the FRAM will be replaced with the existent DRAM, flash memory and SRAM and applied to a mixed device such as a logic circuit.

In order to manufacture an FRAM, a ferroelectric capacitor having a stacked structure of a lower electrode, a ferroelectric film and an upper electrode is formed on an underlying insulation film, and metal wiring such as Al and Cu is provided through a contact hole formed in an oxide film on the stacked structure, thereby to protect the ferroelectric capacitor using a passivation film.

As described above, the FRAM cell can be increased in speed and decreased in power consumption, and a high degree of integration thereof is expected. It is thus necessary to consider a manufacturing process which reduces the area of memory cells and hardly degrades the ferroelectric materials.

In the existent FRAM device, a multilayer wiring technique, which is essential to a high degree of integration and a mixture of the other devices such as a DRAM and logic, has not yet been established.

One reason making it hard to achieve a high degree of integration and form a multilayer wiring layer of an LSI mounted with an FRAM device, is a difficulty in fine dry etching technique for capacitors.

As illustrated in FIG. 1, in the fine dry etching of a capacitor, especially in forming a Pt electrode 101 used as a capacitor electrode on a semiconductor substrate 100, a resist pattern 102, which is to be used in the photolithographic process, is prepared and Pt 101' is processed by reactive ion etching (RIE). Thus, a residue (fence) 103 will be formed and in the subsequent process it cannot be removed, which is a serious problem in miniaturization.

Another reason making it hard to achieve a high degree of integration and multilayer wiring of an LSI mounted with an FRAM device, is that the ferroelectric material used for a capacitor is very weak in reduction atmosphere (especially hydrogen atmosphere). In most of the existent LSI processes, hydrogen is mixed. To fill a via of a multilayer wiring structure, especially a via having a large aspect ratio, chemical vapor deposition (CVD) is used mainly and tungsten (W) is buried in the via. Since, however, hydrogen is generated in the tungsten burying process, the ferroelectric material is damaged greatly.

As shown in FIG. 2, there is a problem in combining an FRAM device and another device. A process of forming a ferroelectric capacitor having a stacked structure of a lower electrode 105, ferroelectric film 106 and an upper electrode 107 in the FRAM device, is executed after the other device is done.

The biggest reason therefor is that the ferroelectric film 106 is weak in reduction atmosphere as described above. Accordingly, a step difference corresponding to the ferroelectric capacitor is caused between the devices, and it becomes difficult to form a wiring layer 109 on a step difference through contact holes of insulation film 108 of the lower layer and insulation film 108' of the upper layer.

As described above, the prior art semiconductor integrated circuit including an FRAM device has a drawback of making it difficult to achieve both a mixture of the FRAM device with another device and a high degree of integration.

BRIEF SUMMARY OF THE INVENTION

The present invention has been developed to resolve the above drawback, and its object is to provide a semiconductor integrated circuit having such a structure as to facilitate a high degree of integration and a mixture of two devices and to easily process an electrode and prevent a ferroelectric capacitor from being damaged.

To attain the above object, according to a first aspect of the present invention, there is provided a semiconductor integrated circuit comprising a ferroelectric capacitor, the ferroelectric capacitor including:

a first insulation film formed above a semiconductor substrate;

a first electrode which is buried in a hole formed in the first insulation film and whose surface is flattened;

a second insulation film formed on the first insulation film and having an opening above the first electrode;

a ferroelectric film formed in the opening; and a second electrode formed in the opening and above the ferroelectric film and flattened so as to be substantially flush with a surface of the second insulation film.

According to a second aspect of the present invention, there is provided a semiconductor integrated circuit comprising a ferroelectric capacitor, the ferroelectric capacitor including:

a first insulation film formed above a semiconductor substrate;

a first electrode which is buried in a hole formed in the first insulation film;

a ferroelectric film which is formed in the hole and above the first electrode and whose surface is flattened;

a second insulation film formed on the first insulation film and having an opening above the ferroelectric film; and a second electrode formed in the opening of the second insulation film.

According to a third aspect of the present invention, there is provided a semiconductor integrated circuit comprising a ferroelectric capacitor, the ferroelectric capacitor including:

a first insulation film formed above a semiconductor substrate;

a first electrode which is buried in a hole formed in the first insulation film and whose surface is flattened;

a second insulation film formed on the first insulation film and having a first opening above the first electrode;

a ferroelectric film formed in the first opening and flattened so as to be substantially flush with a surface of the second insulation film;

a third insulation film formed on the second insulation film and having a second opening above the ferroelectric film; and a second electrode formed in the second opening.

According to a fourth aspect of the present invention, there is provided a method for manufacturing a semiconductor integrated circuit, comprising the steps of:

forming a first insulation film whose surface is flattened, above a semiconductor substrate;

forming a first hole in the first insulation film;

depositing a first electrode film above the first insulation film and then flattening a surface of the first electrode film to form a first electrode in the first hole;

depositing a second insulation film above the. first electrode and the first insulation film;

forming a second hole in the second insulation film above the first electrode; and depositing a ferroelectric film and a second electrode film in sequence in the second hole and then flattening a surface of the second electrode film to form a ferroelectric film and a second electrode in the second hole, wherein the first electrode, the ferroelectric film, and the second electrode constitute a ferroelectric capacitor of a ferroelectric memory According to a fifth aspect of the present invention, there is provided a method for manufacturing a semiconductor integrated circuit, comprising the steps of:

forming a first insulation film whose surface is flattened, above a semiconductor substrate;

forming a first hole in the first insulation film;

depositing a first electrode film and a ferroelectric film in sequence above the first insulation film and then flattening a surface of the ferroelectric film to form a first electrode and a ferroelectric film in the first hole;

depositing a second insulation film above the first electrode, the ferroelectric film and the first insulation film;

forming a second hole in the second insulation film above the ferroelectric film; and depositing a second electrode film in the second hole and then flattening a surface of the second electrode film to form a second electrode in the second hole, wherein the first electrode, the ferroelectric film, and the second electrode constitute a ferroelectric capacitor of a ferroelectric memory.

According to a sixth aspect of the present invention, there is a method for manufacturing a semiconductor integrated circuit, comprising the steps of:

forming a first insulation film whose surface is flattened, above a semiconductor substrate;

forming a first hole in the first insulation film;

depositing a first electrode film above the first insulation film and then flattening a surface of the first electrode film to form a first electrode in the first hole;

depositing a second insulation film above the first electrode and the first insulation film;

forming a second hole in the second insulation film above the first electrode;

depositing a ferroelectric film in the second hole and then flattening a surface of the ferroelectric film to form a ferroelectric film in the second hole;

depositing a third insulation film above the ferroelectric film and the second insulation film;

forming a third hole in the third insulation film above the ferroelectric film; and depositing a second electrode film in the third hole and then flattening a surface of the second electrode film to form a second electrode in the third hole, wherein the first electrode, the ferroelectric film, and the second electrode constitute a ferroelectric capacitor of a ferroelectric memory.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 36 is another cross-sectional view illustrating a step subsequent to that shown in FIGS. 7A and 7B;

FIG. 37 is another cross-sectional view illustrating a step subsequent to that shown in FIG. 36;

FIG. 38 is a cross-sectional view of the structure of part of an LSI manufactured by the method as shown in FIGS. 40 and 41;

FIG. 42 is another cross-sectional view illustrating a step subsequent to the step of FIGS. 24A and 24B;

FIG. 43 is another cross-sectional view illustrating a step subsequent to the step of FIG. 42;

FIG. 44 is another cross-sectional view illustrating an example 6 of the step of manufacturing the LSI according to the second embodiment of the present invention;

DETAILED DESCRIPTION OF THE INVENTION

First to third embodiments of the present invention will now be described with reference to the accompanying drawings.

The first embodiment is directed to a method for manufacturing a bit line under a ferroelectric capacitor of a ferroelectric memory cell when a ferroelectric capacitor section of an FRAM and a wiring of a mixed device are formed in an LSI, wherein the LSI has at least a two-layered wiring structure combined with the FRAM and, e.g., a logic circuit. Examples 1 to 3 of the first embodiment will now be described.

(First Embodiment)

EXAMPLE 1

FIGS. 3 to 9

FIGS. 3 to 9 are cross-sectional and plan pattern views of an LSI which is to be manufactured in sequence through the steps of example 1.

Figure 1:
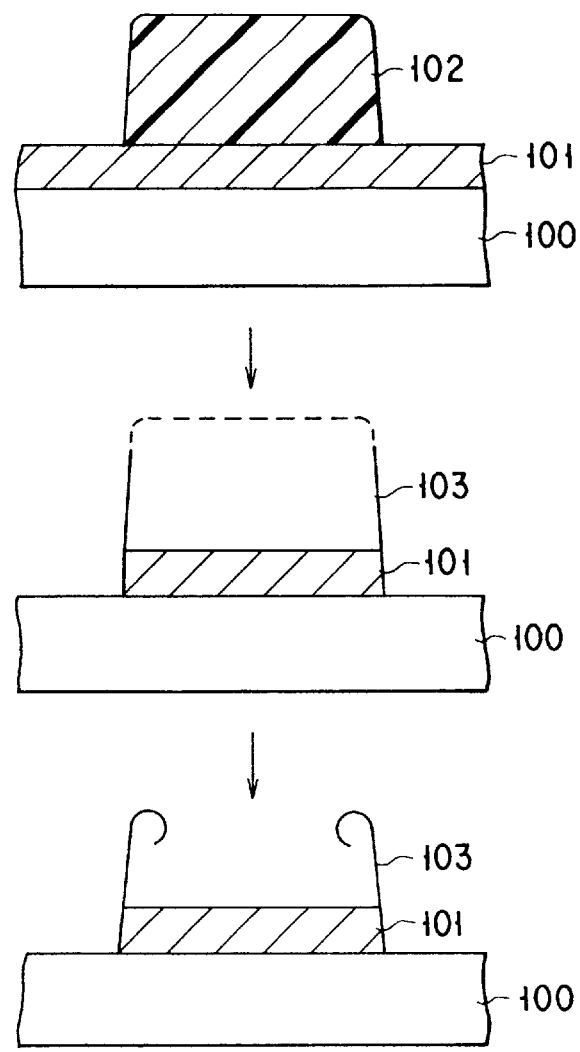
FIG. 1 is a view of a capacitor Pt electrode processed by RIE.
Figure 3:
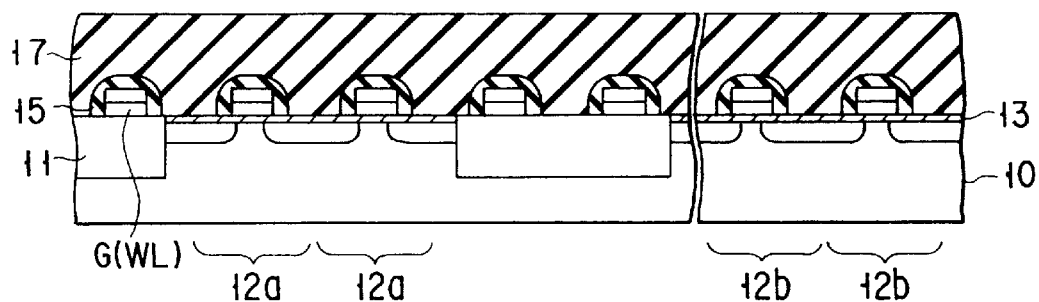
FIG. 3 is a cross-sectional view illustrating a first example of a step of manufacturing an LSI combining an FRAM and another device according to a first embodiment of the present invention.
Figure 2:
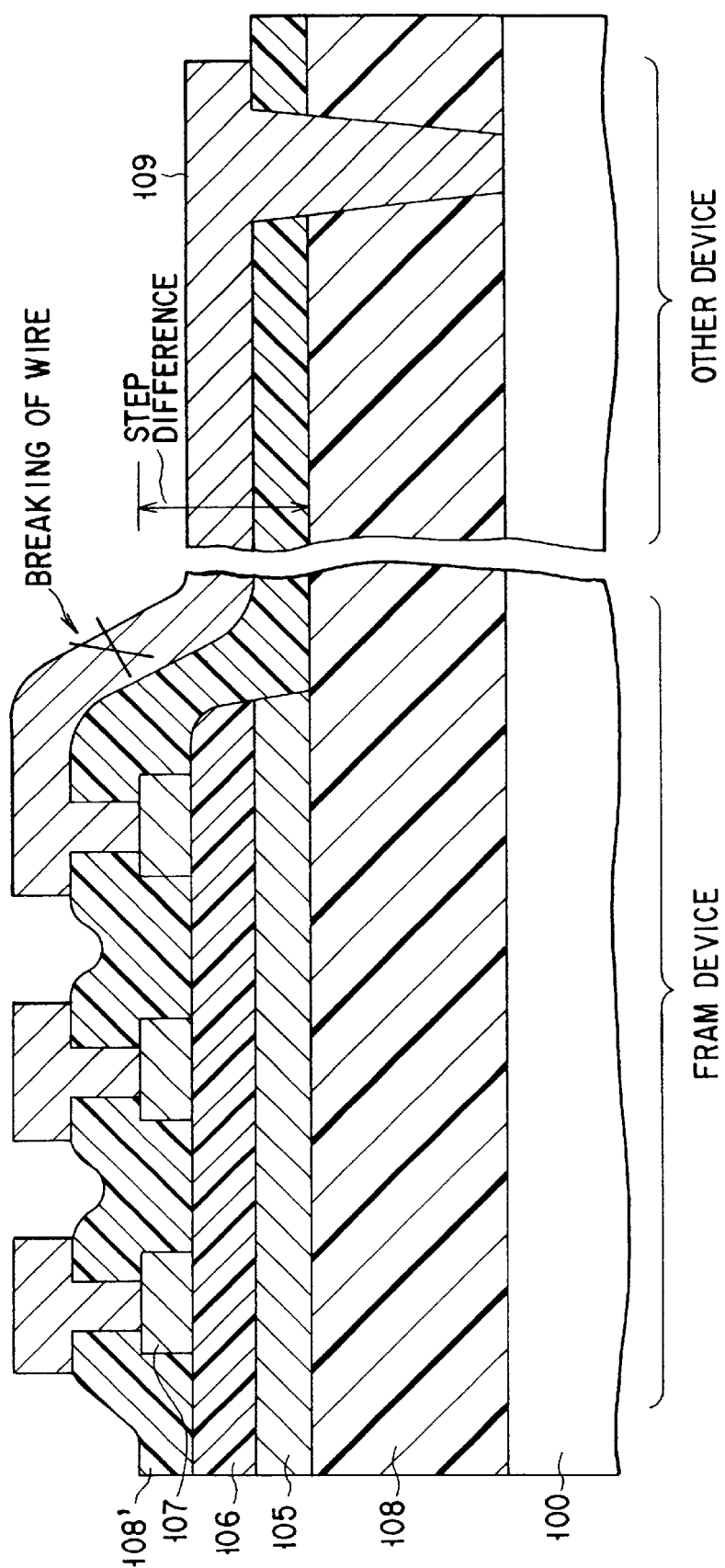
FIG. 2 is a view for explaining a step difference between a ferroelectric memory section and a mixed device.

First, as illustrated in FIG. 3, MOS transistors (pass transistors) 12a for transferring electric charges of memory cells and MOS transistors 12b serving as mixed devices such as logic circuits, are formed on a semiconductor substrate (e.g., silicon substrate) 10.

In FIG. 3, reference numeral 11 indicates an element isolation region selectively formed in a surface region of the substrate, numeral 13 denotes a gate oxide film formed on the surface of the substrate, and symbol G represents gate electrode sections (each of which is part of word line WL) formed on the gate oxide film 13 and used for the MOS transistors.

An arbitrary structure of STI (Shallow Trench Isolation), LOCOS (Local Oxidation of Silicon) or the like can be applied to the element isolation region 11. Each of word lines WL has a two-layered structure of, e.g., phosphorus (P)-doped polysilicon and Wsi, wherein a surface thereof is protected by an insulation film 15. The above MOS transistors are of, for example, an N-channel type, and their drain and source regions are constituted of impurity diffusion layers whose conductivity type is opposite to that of the substrate or that of a well region which are selectively formed in the element surface regions.

Next, a first interlayer insulation film (e.g., BPSG film) 17 is deposited on the substrate including the gate electrode section G and its surface is flattened by CMP (Chemical Mechanical Polishing).

Figure 4:
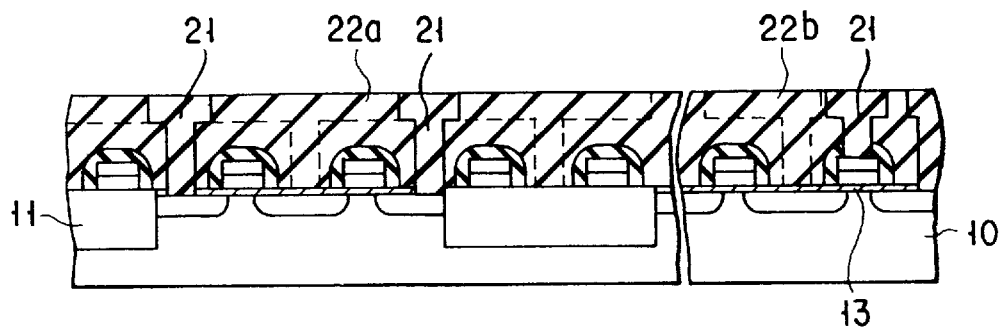
FIG. 4 is a cross-sectional view illustrating a step subsequent to that shown in FIG. 3.

As illustrated in FIG. 4, a trench 22a (indicated by the dotted line) for the bit line, a trench for contact, and a trench 22b (also indicated by the dotted line) for a first wiring layer of the mixed device, are selectively formed in the first interlayer insulation film 17, as are contact holes 21 for wiring and capacitors.

A bit line contact hole 21 is formed in that portion of the bottom of the trench 22a which is located above the drain region of each of the MOS transistors 12a, another contact hole 21 for a capacitor contact plug is formed in that portion of the bottom of the trench for contact which is located above the source region of each of the MOS transistors 12a, and still another contact hole 21 for a wiring contact plug is formed in the bottom of the trench 22b.

The trench 22a for a bit line and trench 22b for a first wiring layer are each indicated by the dotted line since they are hidden in the back of the structure shown in FIG. 4.

Figure 5A:
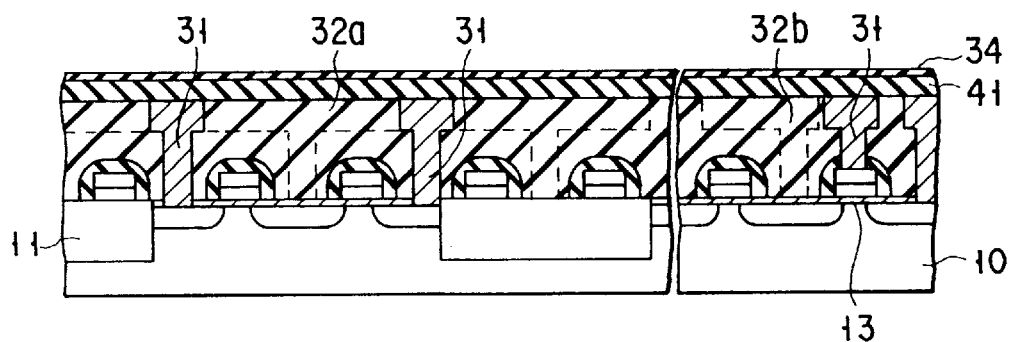
FIG. 5A is a cross-sectional view illustrating a step subsequent to that shown in FIG. 4.

As shown in FIG. 5A, Ti and TiN are evaporated as barrier metals using sputtering, and then a tungsten (W) film is formed using CVD and buried into the contact holes 21 for contact and wiring, and the trenches 22a and 22b.

The resultant structure is flattened by CMP to form a contact plug 31, a bit line (BL) 32a (indicated by a dotted line), and a first wiring layer 32b (indicated by a dotted line) of the mixed device. The bit line 32a and first wiring layer 32b can be formed at the same time. Thus, the number of steps of forming the wiring can be made smaller than in the prior art case.

After that, a second interlayer insulation film 41 is formed and a silicon nitride (SixNy) film 34 or a titanium oxide ($TiO_2$) film is deposited on the surface of the film 41 as an insulation film. The SixNy film 34 serves as a barrier film against oxygen used in the subsequent capacitor forming step and protects an underlying transistor from the oxygen.

Figure 5B:
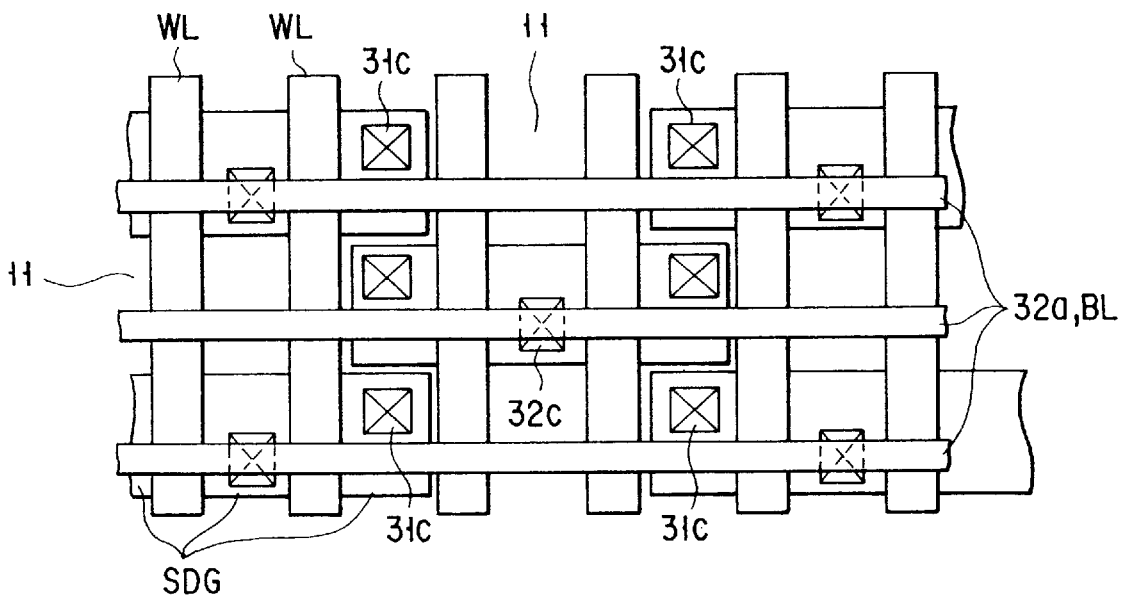
FIG. 5B is a plan view illustrating a step subsequent to that shown in FIG. 4.

FIG. 5B is a plan view partly showing a pattern of a cell array of the FRAM illustrated in FIG. 5A. In FIG. 5B, SDG denotes source, drain and gate regions; WL, word lines; 32a (BL), bit lines; and 31c, first capacitor contact plugs; and 32c, bit line contact plugs.

Figure 6:
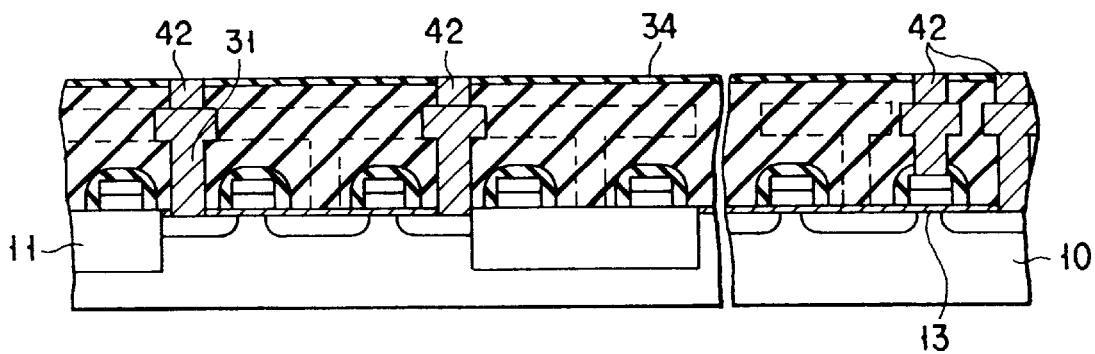
FIG. 6 is a cross-sectional view illustrating a step subsequent to that shown in FIG. 5.

As shown in FIG. 6, a contact hole is formed in the SixNy film 34 and above the contact plug 31 to deposit Ti, TiN and W in sequence. After that, the surface of the SixNy film 34 is exposed and flattened by CMP to form a second capacitor contact plug 42 communicating with the upper portion of the contact plug 31 on the adjacent mixed device side, too, a second contact plug 42 communicating with the contact plug 31 is formed at the same time.

Figure 7A:
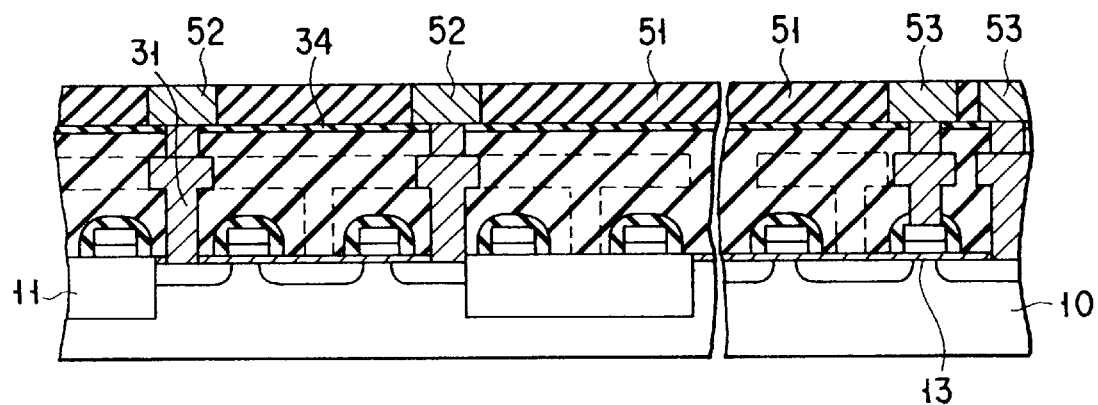
FIG. 7A is a cross-sectional view illustrating a step subsequent to that shown in FIG. 6.

Referring to FIG. 7A, a third interlayer insulation film 51 is formed and then a first trench for a capacitor lower electrode is formed above the second capacitor contact plug 42. After that, a TiN or TiAlN film serving as a barrier metal and Pt for a lower electrode material are deposited in sequence by sputtering, and the surface of the third interlayer insulation film 51 is exposed and flattened by CMP to form the capacitor lower electrode 52.

A second wiring 53 of the adjacent mixed device can be formed at the same time when the capacitor lower electrode 52 is done. Thus, the number of wiring forming steps can be made smaller than in the prior art case.

Figure 7B:
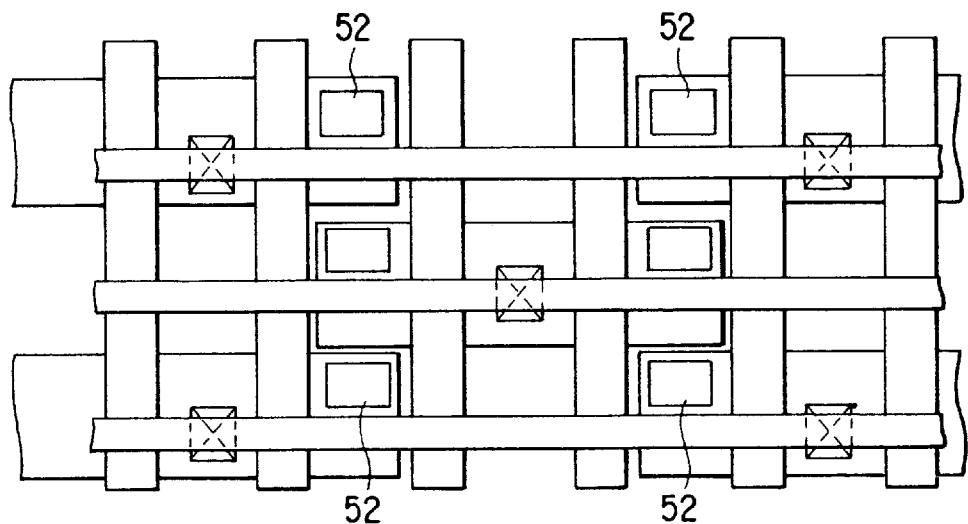
FIG. 7B is a plan view illustrating a step subsequent to that shown in FIG. 6.

FIG. 7B is a plan view partly perspective showing a pattern of part of the FRAM of FIG. 7A. This pattern is the same as that of FIG. 5B except for the capacitor lower electrode 52 being added thereto.

Figure 8A:
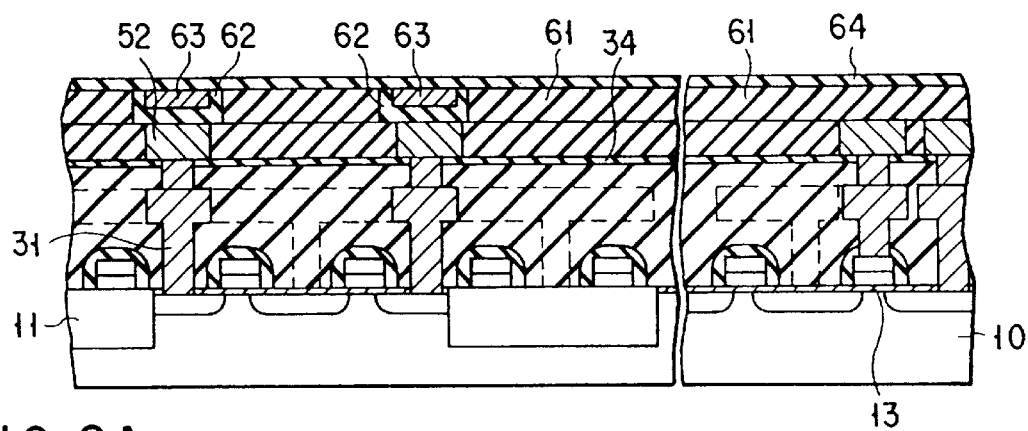
FIG. 8A is a cross-sectional view illustrating a step subsequent to that shown in FIGS. 7A and 7B.

As illustrated in FIG. 8A, a fourth interlayer insulation film 61 is formed and then a second trench for a ferroelectric film and a capacitor upper electrode is formed in that portion of the film 61 which is located above the capacitor lower electrode 52. After that, a lead zirconate titanate (PZT; $Pb(Zr_{1-x}Ti_x)O_3$) serving as a ferroelectric film and platinum (Pt) serving as an upper electrode film are deposited in sequence by sputtering, and the surface of the fourth interlayer insulation film 61 is exposed and flattened by CMP, thereby forming a ferroelectric film 62 and a capacitor upper electrode (capacitor plate line) 63.

In this case, RTA (Rapid Thermal Annealing) is executed at a temperature of 750° C. to crystallize PZT of the ferroelectric film 62 and then deposit the upper electrode (Pt).

Then an SixNy film (or $TiO_2$ film) 64 is deposited as an insulation film. This film 64 serves as a barrier film against hydrogen caused during the subsequent plug burying step and protects the ferroelectric capacitor.

Figure 8B:
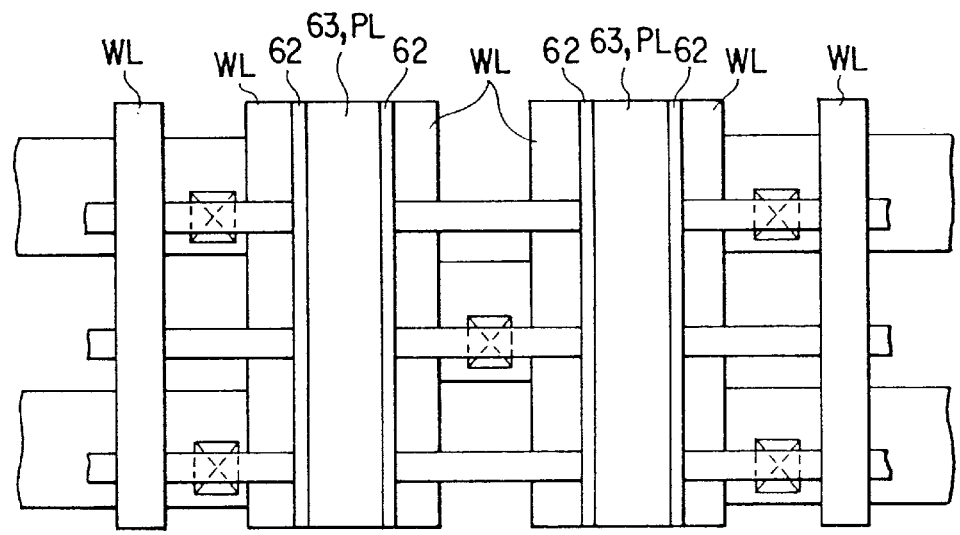
FIG. 8B is a plan view illustrating a step subsequent to that shown in FIGS. 7A and 7B.

FIG. 8B is a plan view partly perspective showing a pattern of part of the FRAM of FIG. 8A. This pattern is the same as that of FIG. 7B except for the ferroelectric film 62 and upper electrode 63 being added thereto. The upper electrode 63 is formed opposite to the capacitor lower electrode (52 in FIG. 7A). The electrode 63 is formed continuously in parallel with the word line WL and used as a capacitor plate line PL.

Figure 9:
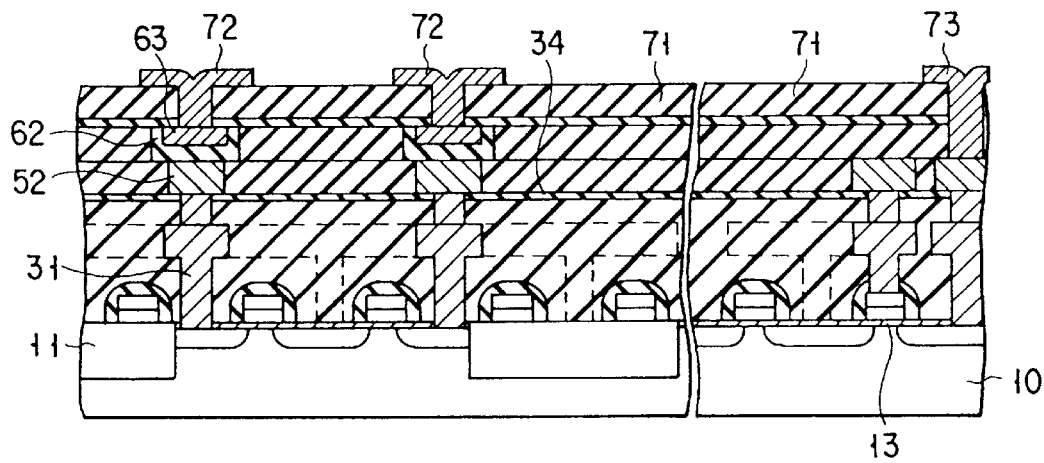
FIG. 9 is a cross-sectional view illustrating a step subsequent to that shown in FIG. 8.

Referring to FIG. 9, after a fifth interlayer insulation film 71 is formed, a wiring contact hole is formed, aluminum (Al) is deposited and RIE is executed to form an aluminum wiring 72. In this case, a third wiring 73 can be formed in the adjacent mixed device at the same time when the Al wiring 72 is done. Thus, the number of steps of forming the wiring layer can be made smaller than in the prior art case.

In an LSI of a two-layered wiring structure, a top passivation insulation film is deposited to open a pad portion, whereas in an LSI of a three or more-layered wiring structure, after the foregoing interlayer insulation film is formed, a wiring layer is formed by aluminum reflow, a patterning step is repeated a required number of times, and a top passivation insulation film is deposited, thereby opening a pad portion.

According to the example 1 of the first embodiment, since the wiring and ferroelectric capacitor are formed by CMP, the ferroelectric capacitor can be processed more easily than by conventional RIE.

Since the lower electrode 52 of the ferroelectric capacitor section and the wiring layer 53 of the adjacent device are formed at the same time, the number of manufacturing steps can be reduced and a step difference between the ferroelectric memory section and the other device is decreased. It is thus evident that wiring can easily be formed between the devices.

As illustrated in FIG. 9, the cell array of the FRAM formed by the process of the example 1 is featured by comprising the first electrode 52 which is buried in the first trench formed in the first insulation film 51 formed above the semiconductor substrate 10 and the surface of which is flattened, the second insulation film 61 deposited on the first insulation film 51 in which the first electrode is buried, the ferroelectric film 62 and second electrode 63 which are formed in sequence in a second trench formed in the second insulation film above the first electrode, and the ferroelectric capacitor section constituted of the first electrode, ferroelectric film, and second electrode.

In the cell array of the FRAM described above, as shown in FIGS. 5B, 7B and 8B, a series-connected structure of one MOS transistor for transferring charges formed in the surface region of the silicon substrate and one ferroelectric capacitor for storing information, is defined as a unit cell. A plurality of unit cells are arranged in a matrix on the plane, and an element isolation (e.g., oxide) film 11 is formed between the element regions (activation regions) SDG to isolate the element regions.

In example 1, the element regions SDG of respective columns are shifted from each other by the length (½ pitch) almost corresponding to one of the element regions, and all the element regions SDG are arranged in a checkered pattern (or in a zigzag pattern different from a positive grid). However, the present invention is not limited to such a pattern. The whole element regions SDG can be arranged in the positive grid.

In each of the element regions SDG, first drain, channel and source regions constituting a first MOS transistor are formed linearly from the central part toward one end, and second drain, channel and source regions constituting a second MOS transistor are formed linearly from the central part toward the other end. The central part is a drain region common to the first and second MOS transistors.

A gate electrode section G is formed on the channel region of each of the MOS transistors through the gate oxide film 13. The gate electrode sections G of MOS transistors of the same row are formed continuously as a word line WL, and groups of word lines WL are formed in parallel with each other. Furthermore, the word line groups extend in a direction perpendicular to that of the arrangement of the element regions SDG.

Groups of bit lines BL are buried in the first interlayer insulation film 17 in a direction perpendicular to that of formation of the word line groups.

The bit line contact plug 32c is buried in an opening of the first interlayer insulation film 17 above an impurity diffusion region (an n-type drain region in the N-channel MOS transistor) of the central part of the element regions SDG, and the bit lines BL are formed in the trench of the first interlayer insulation film 17 so as to extend on the bit line contact plug 32c. Thus, each of the bit lines BL contacts its corresponding one of drain regions of the element regions SDC in the same column through the bit line contact plug 32c.

The first capacitor contact plug 31 is formed in the first interlayer insulation film 17 above a corresponding impurity diffusion region (an n-type source region in the N-channel MOS transistor) of one end portion of the element regions SDG.

The second interlayer insulation film 41 and SixNy film (or $TiO_2$ film) 34 are formed on the upper surface of the bit line BL and part of the upper surface of the first capacitor contact plug 31. The second capacitor contact plug 42, which communicates with the first capacitor contact plug 31, is formed in these films 41 and 34.

The third interlayer insulation film 51 is formed to flatten the surface of the substrate, and the ferroelectric capacitor (lower electrode 52, ferroelectric film 62, upper electrode 63) having a stacked structure is formed on the film 51 so as to cover the upper portion of the source region of the SDG regions.

A plurality of element regions SDG adjacent in the column direction are shifted from each other pitch by pitch. The source regions of the element regions SDG and the lower electrodes 52 are arranged in line in the column direction, and the upper electrodes 63 are formed on their corresponding lower electrodes 52 continuously in a direction (perpendicular to the bit lines BL) parallel with that of formation of the word line groups through the ferroelectric film 62 and serve as a capacitor plate line PL.

Furthermore, in FIG. 8A, the ferroelectric film 62 is wider than the upper electrode 52. However, a shape of the ferroelectric capacitor may be changed.

FIG. 36 is another cross-sectional view illustrating a step subsequent to that shown in FIG. 7.

This cross sectional view is the same as that of FIG. 8A except that the capacitor lower electrode 52 is wider than the ferroelectric film 62.

FIG. 37 is another cross-sectional view illustrating a step subsequent to that shown in FIG. 36. This cross sectional view is the same as that of FIG. 9 except that the capacitor lower electrode 52 is wider than the ferroelectric film 62.

A plurality of examples of the step of forming a ferroelectric capacitor section using CMP, as shown in the above example 1 of the first embodiment, will now be described in detail.

Figure 12:
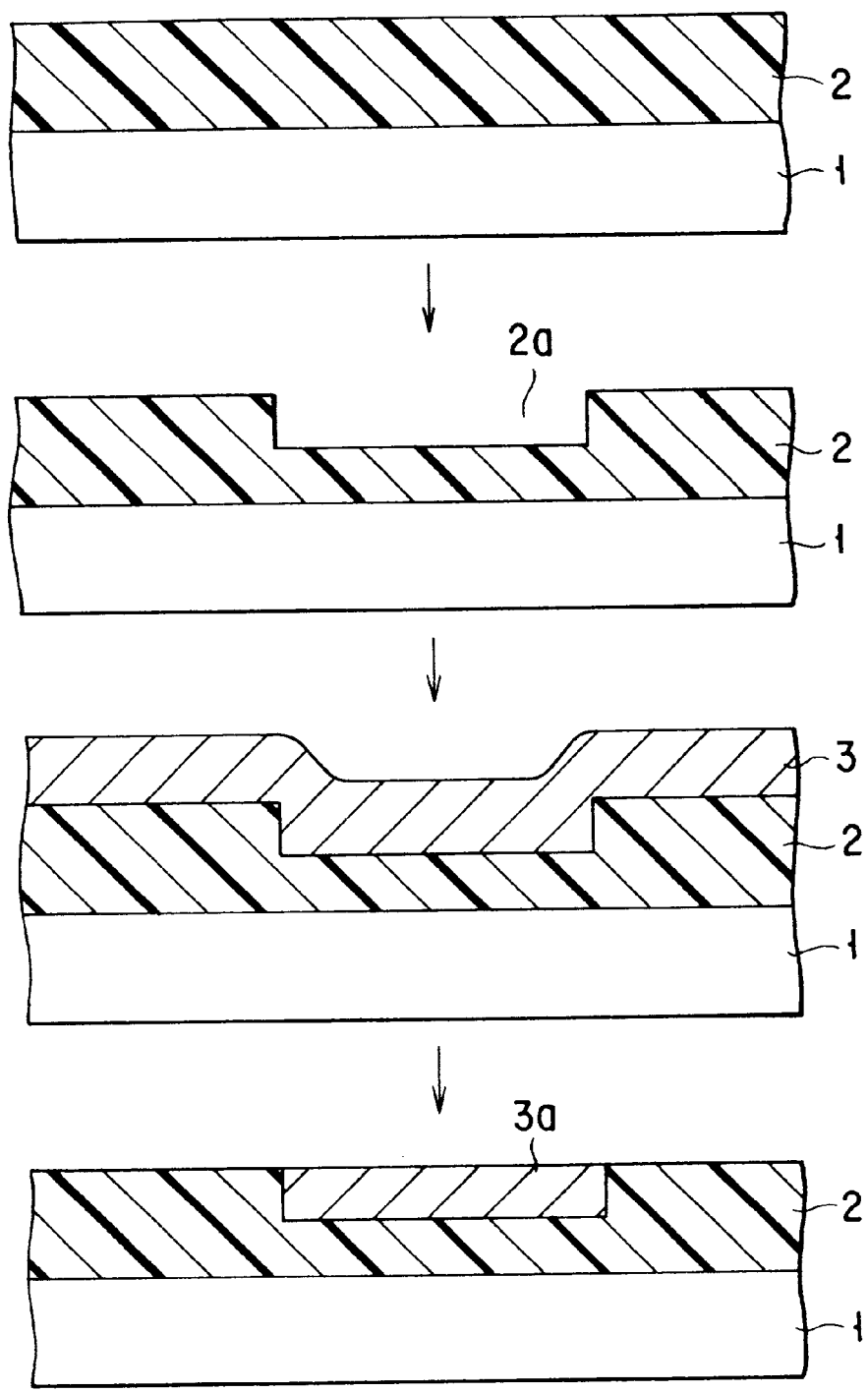
FIG. 12 is a cross-sectional view showing a first example of a step of forming a ferroelectric capacitor section using CMP in the step of manufacturing an LSI of the present invention.
Figure 13:
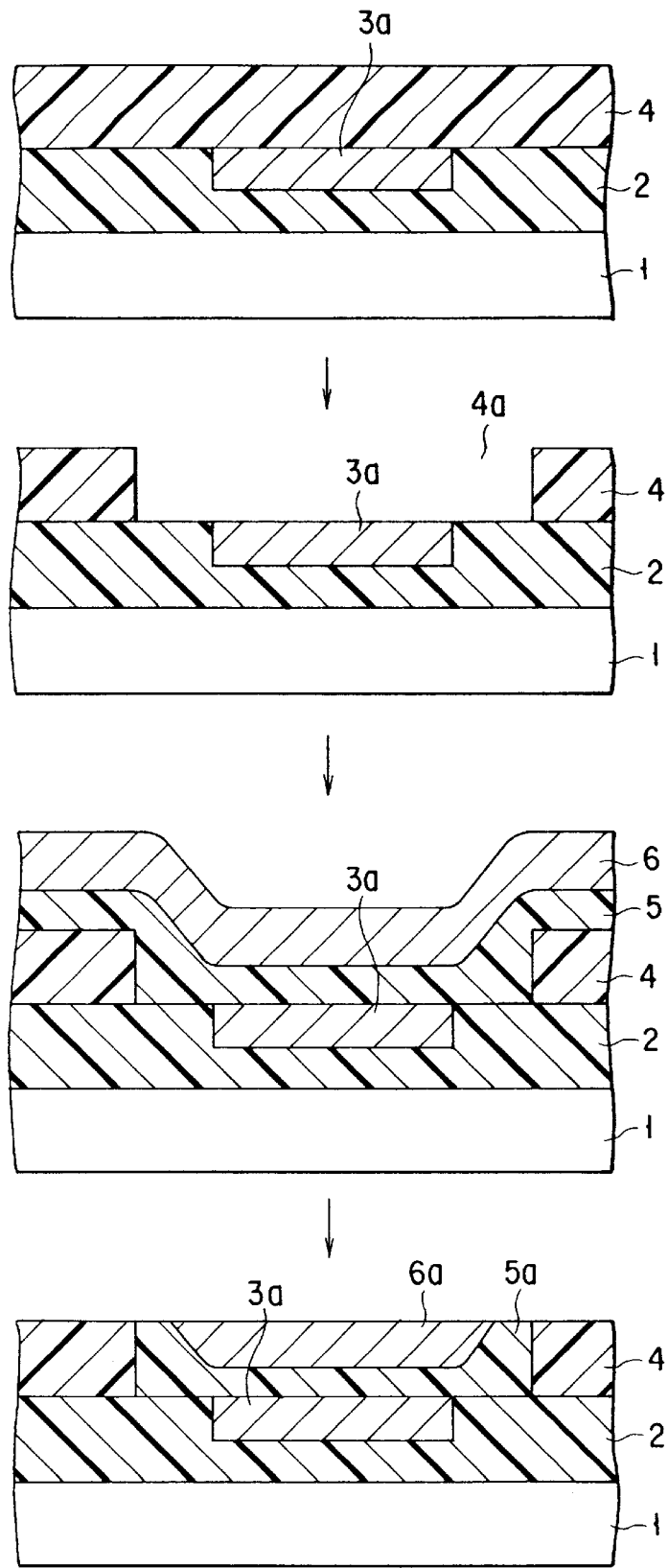
FIG. 13 is a cross-sectional view illustrating a step subsequent to the step of FIG. 12.
Figure 14:
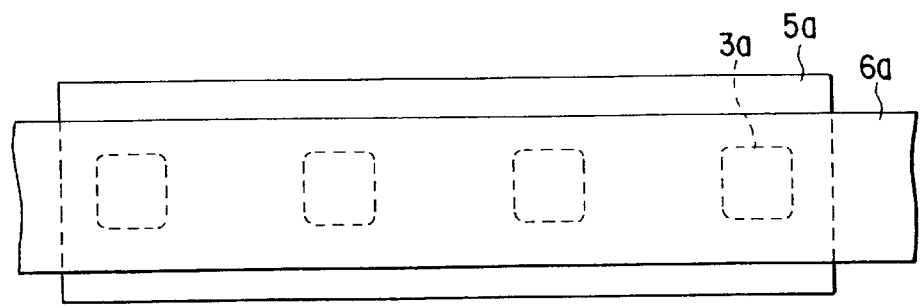
FIG. 14 is a plan view illustrating the ferroelectric capacitor section formed through the steps of FIGS. 12 and 13.

(First example of the step of forming a ferroelectric capacitor section, FIGS. 12 to 14)

First, as illustrated in FIG. 12, a first trench 2a is formed by RIE in the first insulation film (oxide film) 2 which is formed on the silicon substrate 1 and whose surface is flat. Then, a lower electrode film 3 is deposited and buried in the first trench 2a and its surface is flattened by CMP to form a lower electrode 3a.

Thereafter, as shown in FIG. 13, a second insulation film (oxide film) 4 is deposited on the first insulation film 2 which is flattened by the buried lower electrode 3a, and a second trench 4a is formed by RIE. After that, a ferroelectric film 5 and an upper electrode film 6 are deposited and buried in sequence in the second trench 4a, and their surfaces are flattened by CMP thereby to form a capacitor insulation film 5a and an upper electrode 6a.

Figure 39:
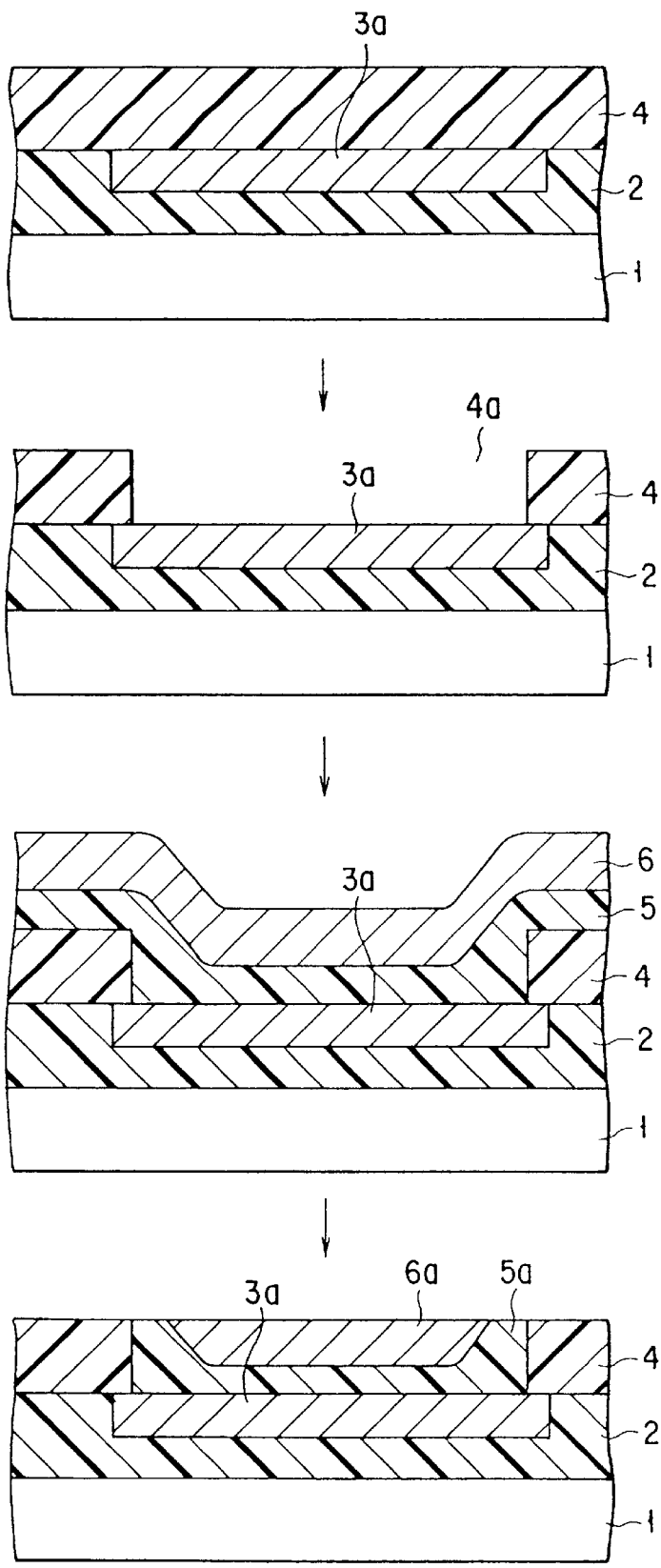
FIG. 39 is another cross-sectional view illustrating a step subsequent to the step of FIG. 12.

As above described, a shape of the ferroelectric capacitor may be changed. FIG. 39 is another cross sectional view illustrating a step subsequent to the step of FIG. 12. This cross sectional view is the same as that of FIG. 13 except that the capacitor lower electrode 3a is wider than the ferroelectric film 5a.

FIG. 14 shows an example of a pattern of the foregoing ferroelectric capacitor section. The lower electrodes 3a of a plurality of ferroelectric capacitor sections are arranged in line, the second trench and ferroelectric film 5a buried therein each have a width which is greater than that of the lower electrode 3a and are formed in common to regions including the upper portions of the lower electrodes 3a, and the upper electrodes 6a are formed continuously in their arrangement direction above the lower electrodes 3a.

According to the ferroelectric capacitor section so formed, the area of the lower electrodes 3a can correctly be determined and so can that of the capacitor.

Figure 15:
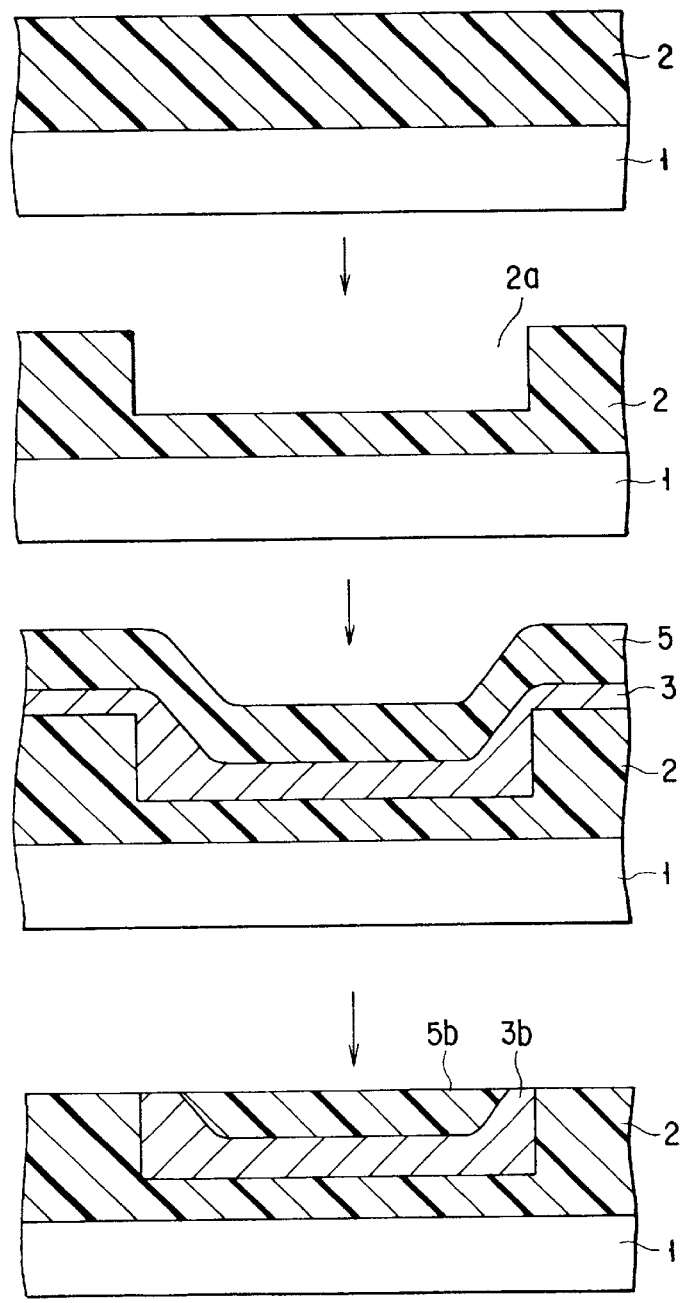
FIG. 15 is a cross-sectional view showing a second example of the step of forming a ferroelectric capacitor section using CMP in the step of manufacturing an LSI of the present invention.
Figure 16:
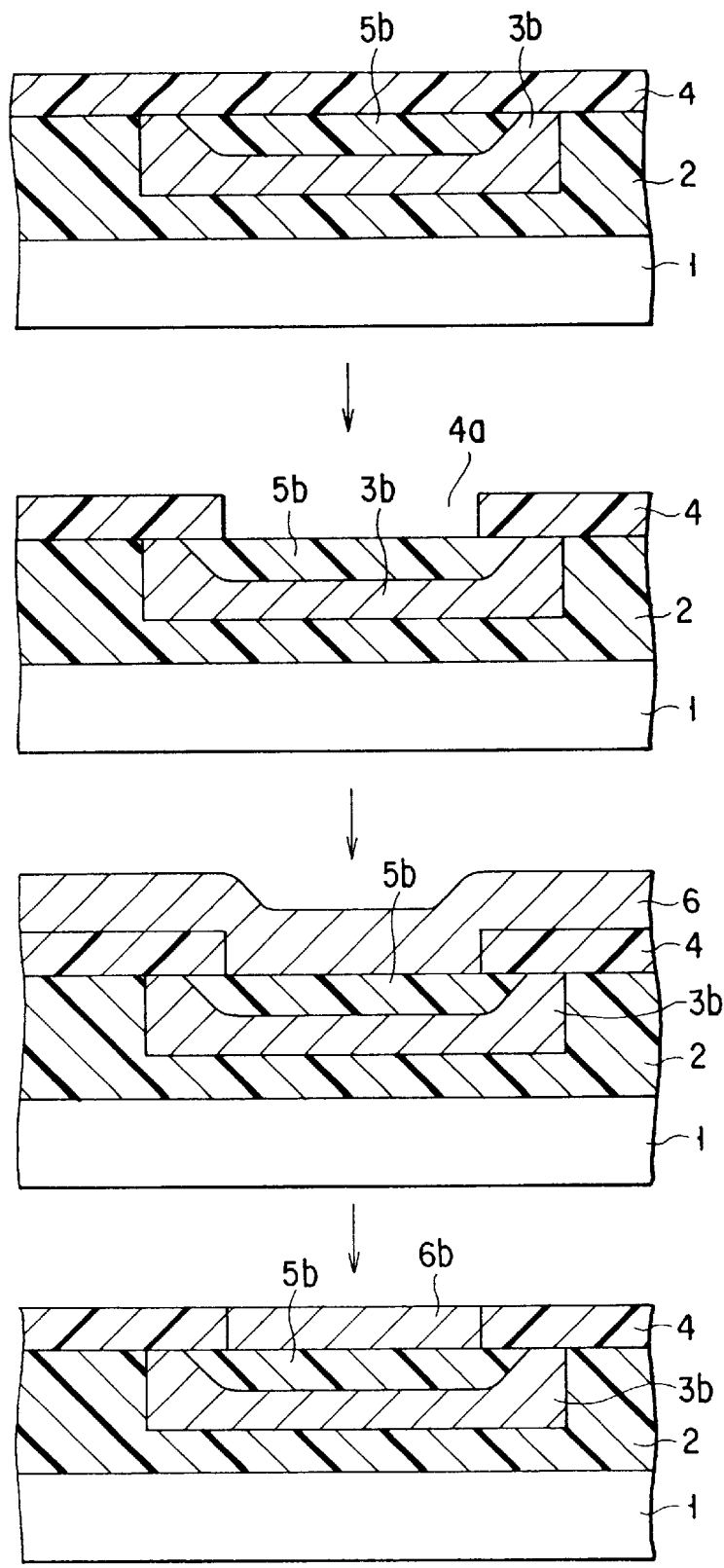
FIG. 16 is a cross-sectional view illustrating a step subsequent to that of FIG. 15.
Figure 17:
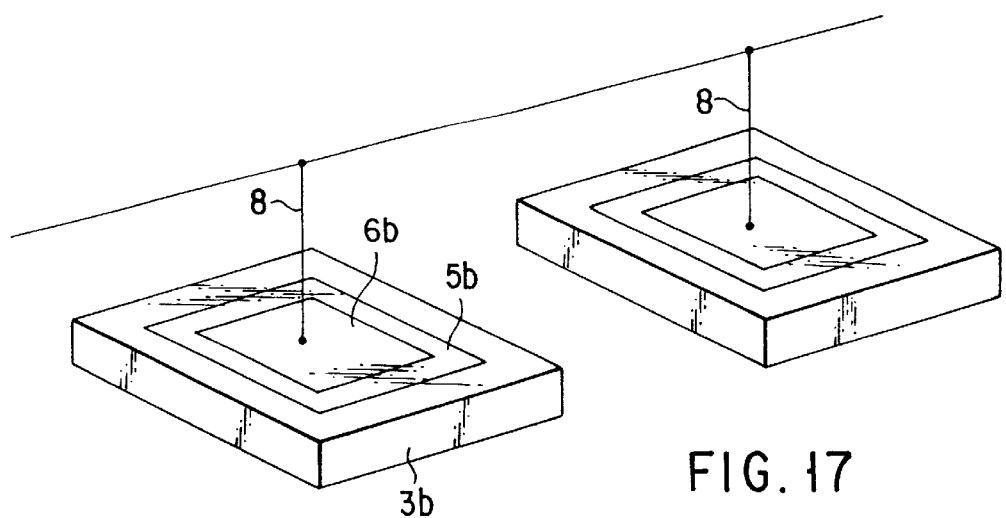
FIG. 17 is a perspective view illustrating the ferroelectric capacitor section formed through the steps of FIGS. 15 and 16.

(Second example of the step of forming a ferroelectric capacitor section, FIGS. 15 to 17)

First, as illustrated in FIG. 15, a first trench 2a is formed by RI in the first insulation film (oxide film) 2 which is formed above the silicon substrate 1 and whose surface is flattened. Then, a lower electrode film 3 and a ferroelectric film 5 are deposited and buried in the first trench 2a and the surface of the ferroelectric film is flattened by CMP to form a lower electrode 3b and a capacitor insulation film 5b.

Thereafter, as shown in FIG. 16, a second insulation film (oxide film) 4 is deposited on the first insulation film 2 which is flattened, and a second trench 4a is formed by RIE. After that, an upper electrode film 6 is deposited and buried in the second trench 4a, and its surface is flattened by CMP thereby to form an upper electrode 6b.

FIG. 17 shows an example of a pattern of the ferroelectric capacitor section so formed. The lower electrodes 3b and capacitor insulation films 5b of a plurality of ferroelectric capacitor sections buried in the first trench are formed separately from each other and arranged in line in each cell.

The second trench 4a and the upper electrode 6b buried therein correspond to the capacitor insulation films 5b and each have an area which is smaller than that of each of the capacitor insulation films 5b. Each of the upper electrodes 6b is connected to an electrode lead-out wiring 8.

According to the ferroelectric capacitor section so formed, the area of the upper electrodes 6b can correctly be determined and so can that of the capacitor.

(Third example of the step of forming a ferroelectric capacitor section, FIGS. 18 to 21)

Figure 18:
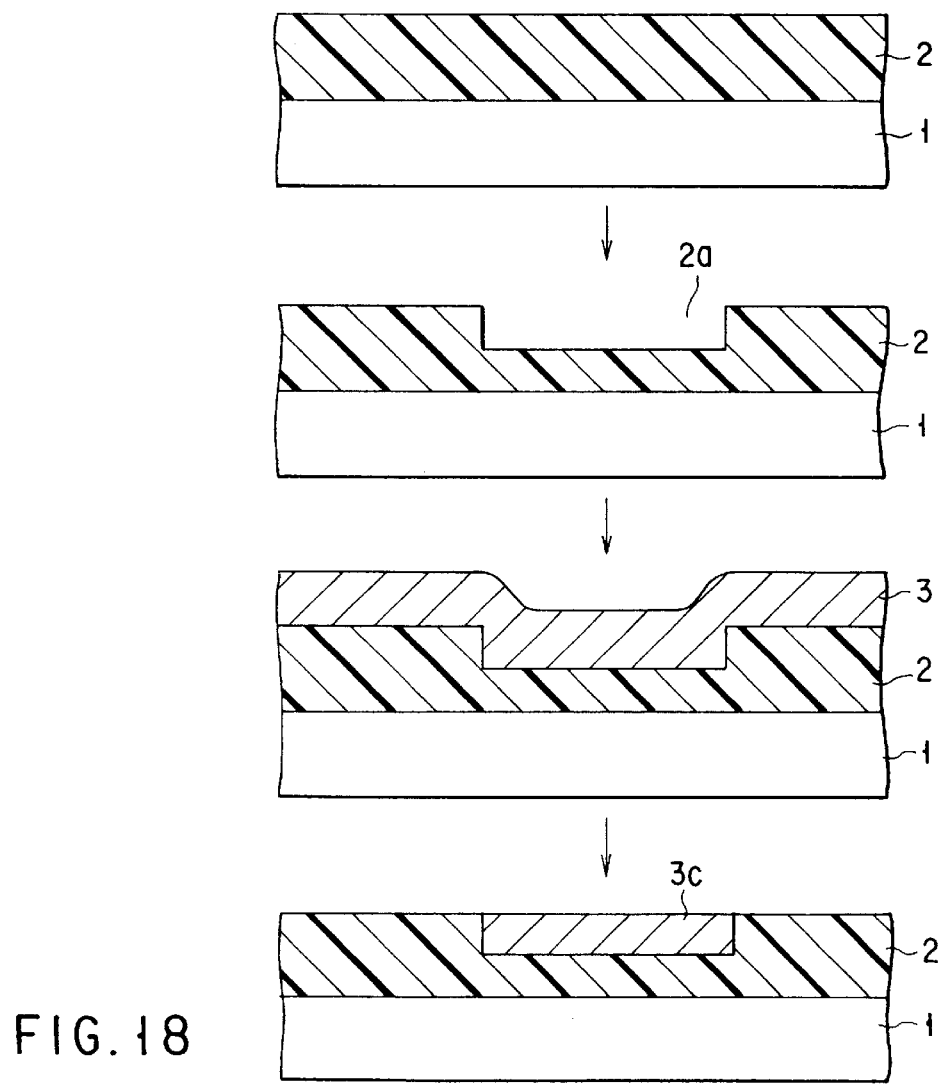
FIG. 18 is a cross-sectional view showing a third example of the step of forming a ferroelectric capacitor section using CMP in the step of manufacturing an LSI of the present invention.

First, as illustrated in FIG. 18, a first trench 2a is formed by RIE in the first insulation film (oxide film) 2 which is formed on the silicon substrate 1 and whose surface is flattened. Then, a lower electrode film 3 is deposited and buried in the first trench 2a and its surface is flattened by CMP to form a lower electrode 3c.

Figure 19:
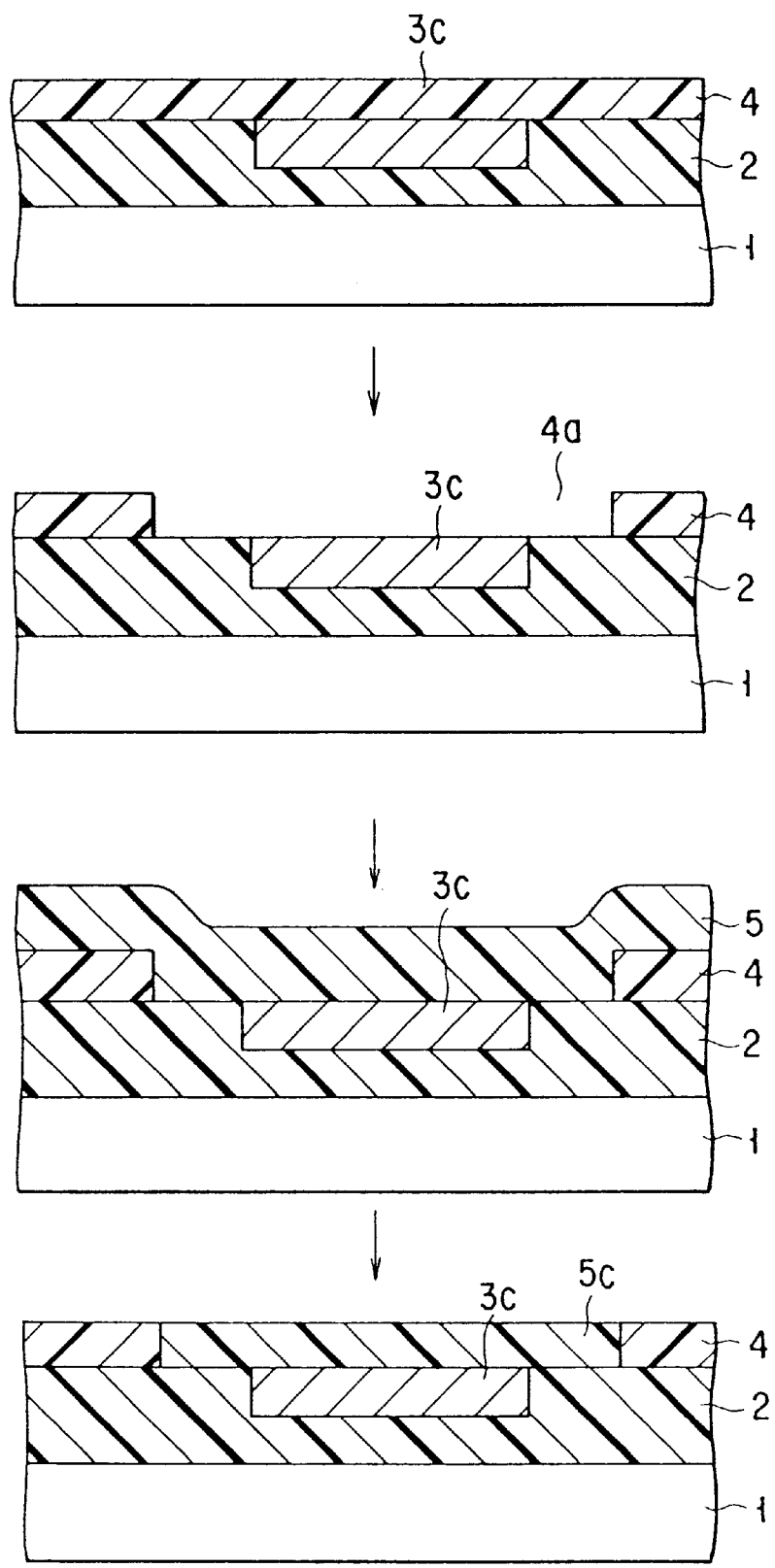
FIG. 19 is a cross-sectional view illustrating a step subsequent to that shown in FIG. 18.

Thereafter, as shown in FIG. 19, a second insulation film (oxide film) 4 is deposited on the first insulation film 2 which is flattened, and a second trench 4a is formed by RIE. After that, a ferroelectric film 5 is deposited and buried in the second trench 4a, and its surface is flattened by CMP thereby to form a capacitor insulation film 5c.

Figure 20:
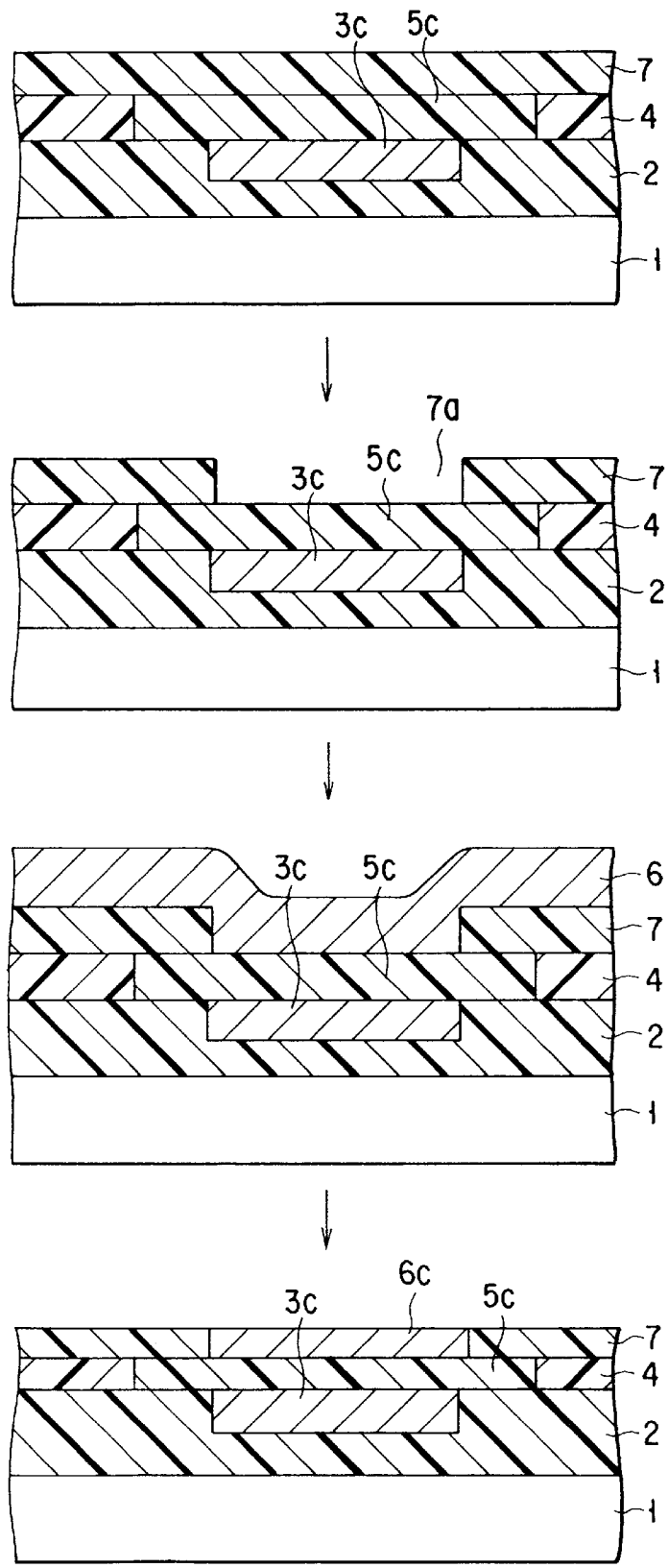
FIG. 20 is a cross-sectional view illustrating a step subsequent to that shown in FIG. 19.

Thereafter, as shown in FIG. 20, a third insulation film (oxide film) 7 is deposited on the second insulation film 4 which is flattened, and a third trench 7a is formed by RIE. After that, an upper electrode film 6 is deposited and buried in the third trench 7a, and its surface is flattened by CMP thereby to form an upper electrode 6c.

Figure 21:
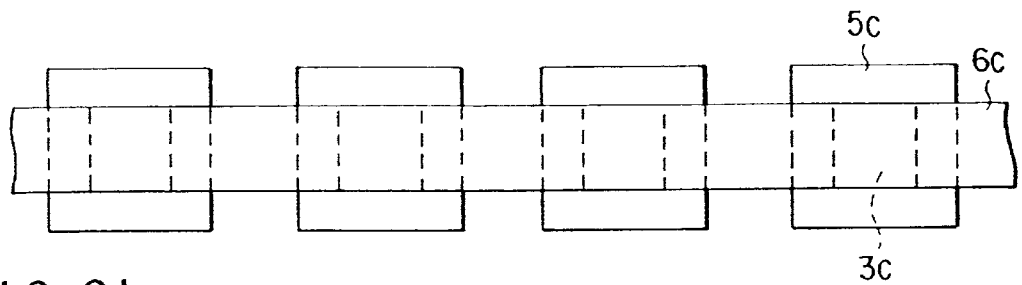
FIG. 21 is a plan view illustrating the ferroelectric capacitor section formed through the steps of FIGS. 18 to 20.

FIG. 21 shows an example of a pattern of the ferroelectric capacitor section so formed. The lower electrodes 3c of a plurality of ferroelectric capacitor sections are arranged in line, and the second trench and the ferroelectric film 5c buried therein correspond to the lower electrodes 3c and each have an area which is larger than that of each lower electrode 3c, while the third trench and the upper electrodes 6c buried therein are formed continuously in their arrangement direction above the lower electrodes 3c of the ferroelectric capacitor sections.

According to the ferroelectric capacitor section so formed, the area of the lower electrodes 3c can correctly be determined and so can that of the capacitor.

There is a method of forming a ferroelectric capacitor section other than those of the above first to third examples, though not shown. According to this method, a trench for burying a ferroelectric capacitor is formed in an underlying insulation film the surface of which is flattened, a lower electrode film, a ferroelectric film and an upper electrode film are buried together in the trench, and the surface of the resultant structure is flattened by CMP. In this method, however, the area of the upper electrode is difficult to control and the capacity of the ferroelectric capacitor varies greatly.

In other words, the foregoing first to third examples are the most suitable for forming a ferroelectric capacitor section using CMP in LSI with a higher degree of integration.

Figure 40:
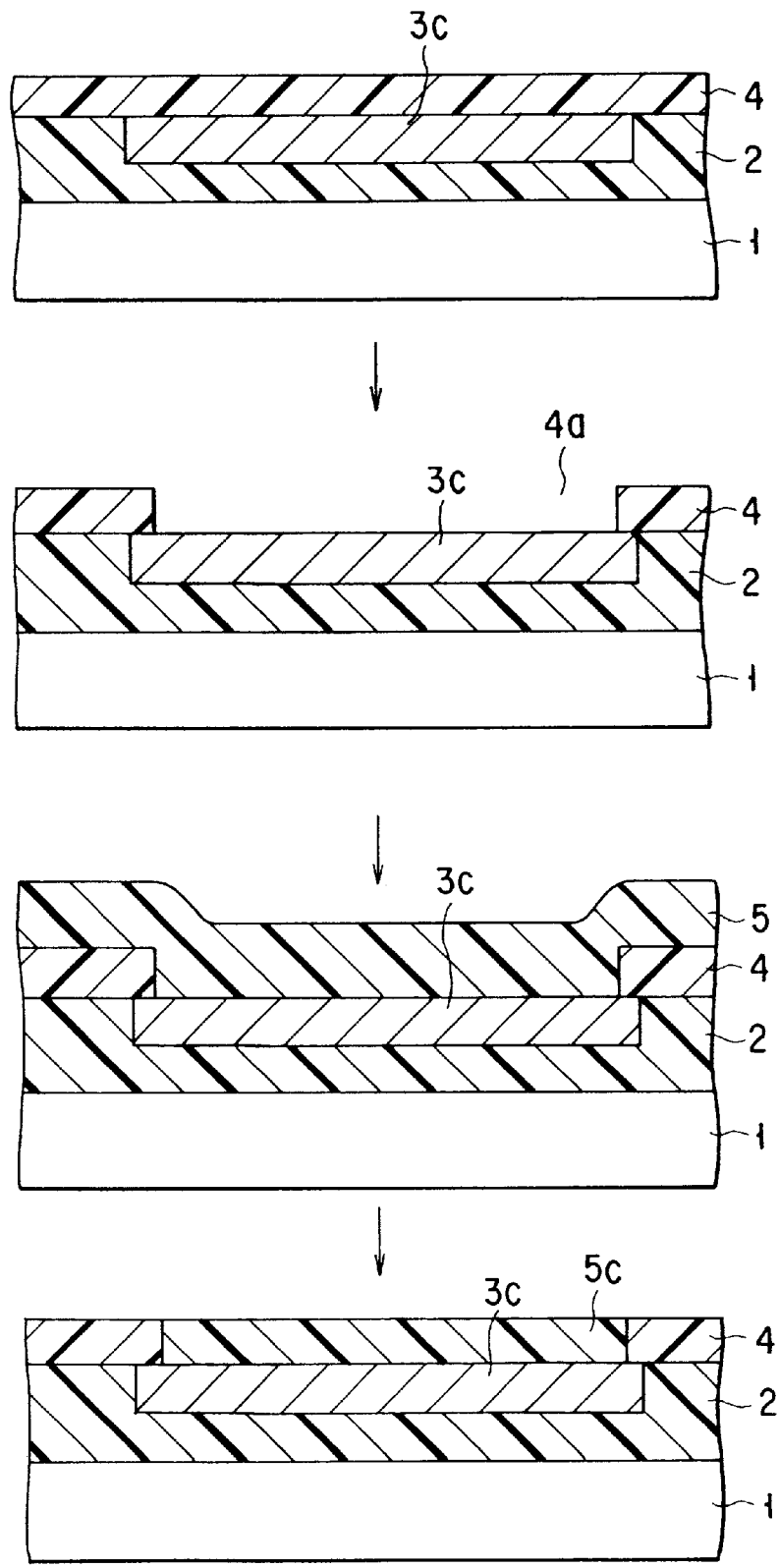
FIG. 40 is another cross-sectional view illustrating a step subsequent to the step of FIG. 18.
Figure 41:
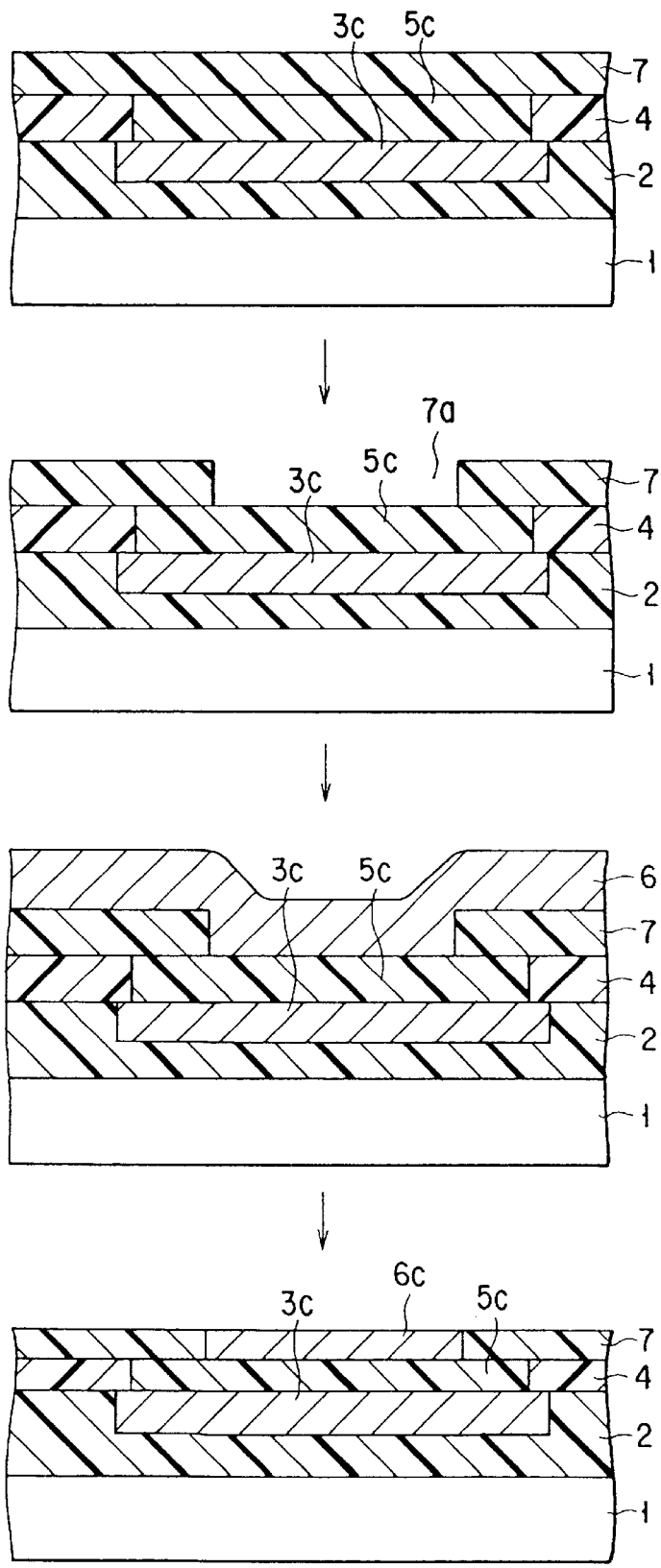
FIG. 41 is another cross-sectional view illustrating a step subsequent to the step of FIG. 40.

As above described, a shape of the ferroelectric capacitor may be changed. FIG. 40 is another cross sectional view illustrating a step subsequent to the step of FIG. 18. This cross sectional view is the same as that of FIG. 19 except that the capacitor lower electrode 3c is wider than the ferroelectric film 5c. FIG. 41 is another cross-sectional view illustrating a step subsequent to the step of FIG. 40. This cross sectional view is the same as that of FIG. 20 except that the capacitor lower electrode 3c is wider than the ferroelectric film 5c.

EXAMPLE 2

FIG. 10

Figure 10:
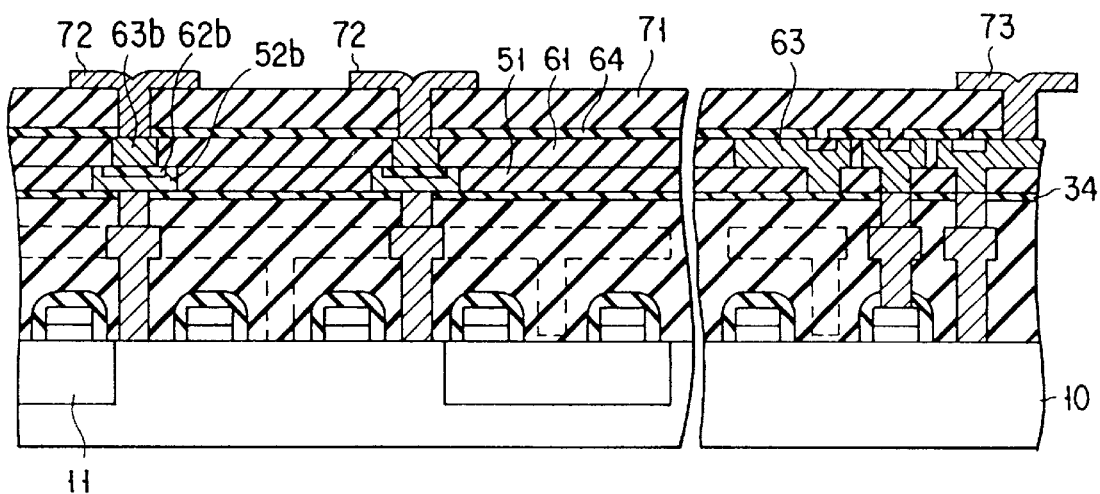
FIG. 10 is a cross-sectional view illustrating an example 2 of the step of manufacturing the LSI according to the first embodiment of the present invention.

FIG. 10 is a cross-sectional view of the structure of part of an LSI manufactured by the step of example 2. In example 2, the first example of the method for manufacturing a ferroelectric capacitor section is replaced with the second example thereof.

In FIG. 10, reference numeral 52b indicates a lower electrode, 62b shows a ferroelectric film, and 63b denotes an upper electrode, and the other constituting elements are the same as those of FIG. 9 and indicated by the same reference numerals.

EXAMPLE 3

FIG. 11

Figure 11:
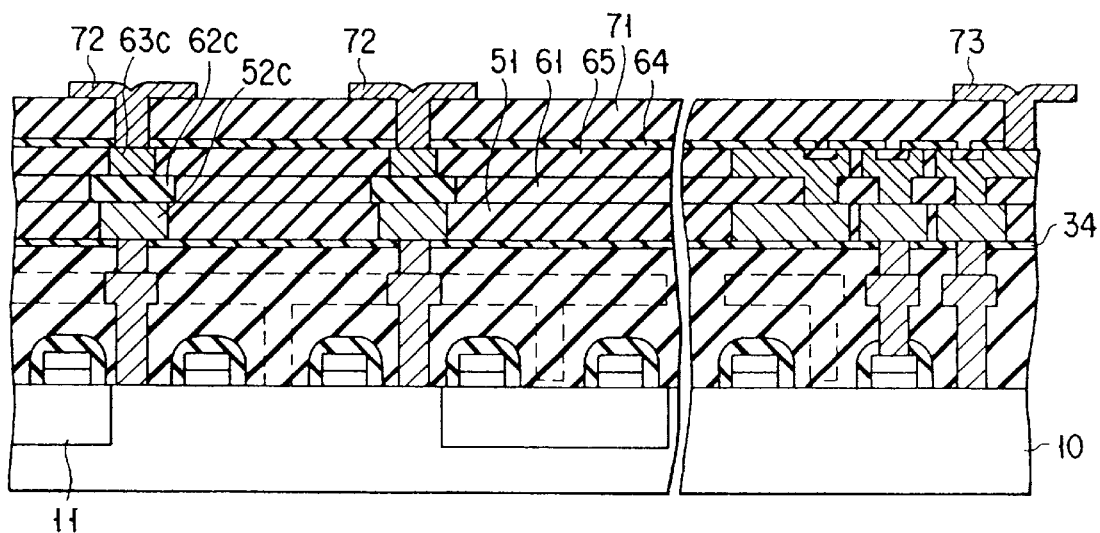
FIG. 11 is a cross-sectional view illustrating an example 3 of the step of manufacturing the LSI according to the first embodiment of the present invention.

FIG. 11 is a cross-sectional view of the structure of part of an LSI manufactured by the step of example 3. In example 3, the first example of the method for manufacturing a ferroelectric capacitor section is replaced with the third example thereof.

In FIG. 11, reference numeral 52c indicates a lower electrode, 62c shows a ferroelectric film, 63c denotes an upper electrode, and 65 represents an insulation film, and the other constituting elements are the same as those of FIG. 9 and indicated by the same reference numerals.

FIG. 38 is a cross-sectional view of the structure of part of an LSI manufactured by the method as shown in FIGS. 40 and 41. This cross sectional view is the same as that of FIG. 11 except that the capacitor lower electrode 52C is wider than the ferroelectric film 62C.

(Second Embodiment)

EXAMPLES 4 to 6

The second embodiment is directed to a step of manufacturing an LSI in which a bit line is formed above a ferroelectric capacitor section of a ferroelectric memory cell. Examples 4 to 6 will now be described.

EXAMPLE 4

FIGS. 22 to 26

FIGS. 22 to 26 are sectional pattern views and plan views of the structure of an LSI manufactured using the same step as that of the first example for forming a ferroelectric capacitor section in the first embodiment.

Figure 22:
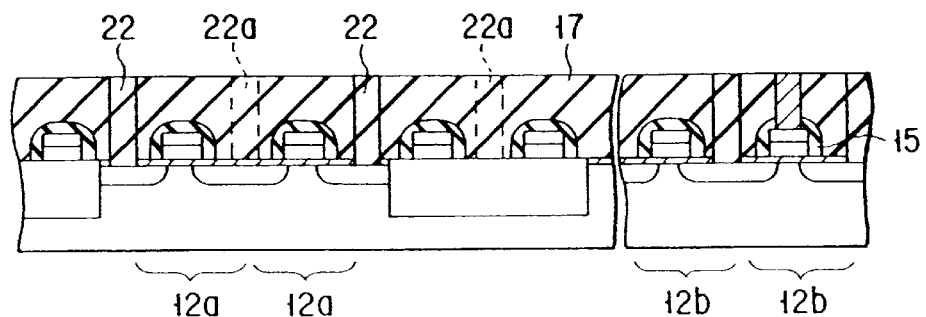
FIG. 22 is a cross-sectional view illustrating an example 4 of a step of manufacturing an LSI combining an FRAM and another device according to a second embodiment of the present invention.

First, as illustrated in FIG. 22, after a field oxide film 11, switching MOS transistors 12a and 12b, and a gate electrode surface insulation film 15 are formed, a first interlayer insulation film 17 (e.g., BPSG) is formed and then the surface of the first interlayer insulation film 17 is flattened by CMP. After that, a contact hole 22 for capacitors, another contact hole 22a for upper bit lines, and the like are formed.

Figure 23A:
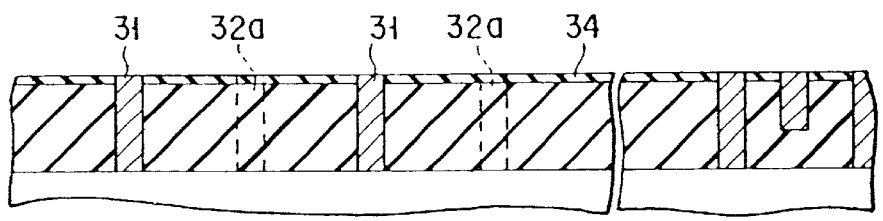
FIG. 23A is a cross-sectional view illustrating a step subsequent to that shown in FIG. 22.

As shown in FIG. 23A, Ti and TiN are evaporated as barrier metals, and then a tungsten (W) film is formed using CVD and buried into the contact holes 22 and 22a to form contact plugs 31 and 32a. After that, the surface of the first interlayer insulation film 17 is exposed by etch back or CMP.

A SixNy (or $TiO_2$) film 34 is deposited on the flattened surface of the film 17 as an insulation film. The SixNy film 34 serves as a barrier film against oxygen used in the subsequent capacitor forming step and protects an underlying transistor from the oxygen.

Figure 23B:
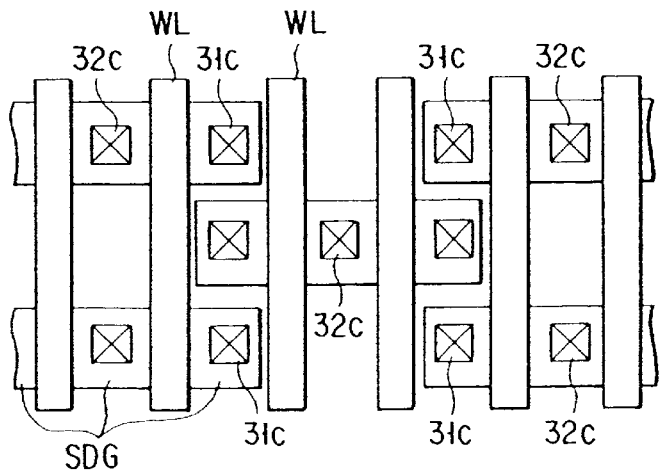
FIG. 23B is a plan view illustrating a step subsequent to that shown in FIG. 22.

FIG. 23B is a plan view partly showing a pattern of part of the FRAM illustrated in FIG. 23A. In FIGS. 23A and 23B, SDG denotes source, drain and gate regions of an MOS transistor 12a, WL shows word lines, 31c indicates capacitor contact plugs, and 32a denotes first bit line contact plugs.

Figure 24A:
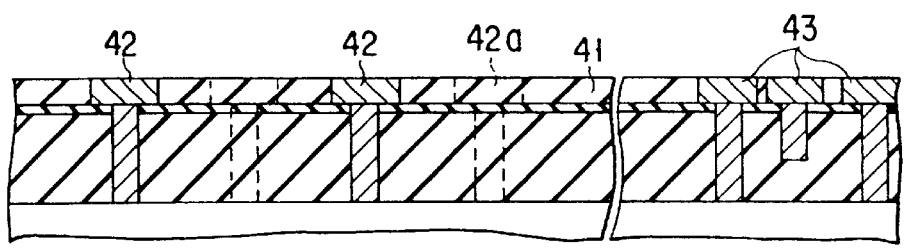
FIG. 24A is a cross-sectional view illustrating a step subsequent to that shown in FIGS. 23A and 23B.

As shown in FIG. 24A, after a second interlayer insulation film 41 is formed on the flattened SixNy film 34, a trench for forming a capacitor lower electrode is formed in a region in which the capacitor lower electrode will be formed, and a trench for contacts of the first bit line contact plugs and a trench for the first wiring layer of the mixed device are formed. TiN or TiAIN serving as a barrier metal and Pt serving as a lower electrode film are deposited in sequence.

After that, the surface of the second interlayer insulation film 41 is exposed to leave capacitor lower electrodes 42 in the trench. When the electrodes 42 are formed, a contact portion 42a of the first bit line contact plugs and a first wiring layer 43 of the adjacent mixed device can be formed. Thus, the number of steps of forming the wiring layer can be made smaller than in the prior art case.

Figure 24B:
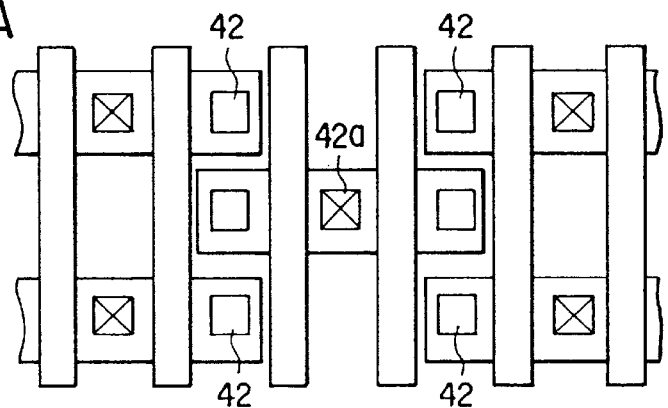
FIG. 24B is a plan view illustrating a step subsequent to that shown in FIGS. 23A and 23B.

FIG. 24B is a plan view partly showing a pattern of part of the FRAM of FIG. 24A. This pattern is the same as that of FIG. 23B except for the lower electrodes 42 and contact portions 42a added thereto.

Figure 25A:
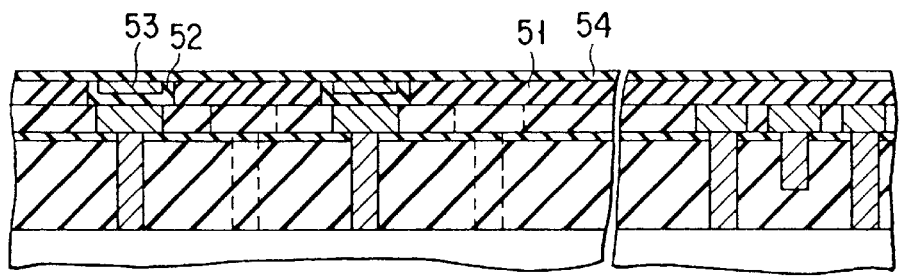
FIG. 25A is a cross-sectional view illustrating a step subsequent to that shown in FIGS. 24A and 24B.

As illustrated in FIG. 25A, a third interlayer insulation film 51 is formed on the flattened second interlayer insulation film 41. After that, a second trench for both a ferroelectric film and a capacitor upper electrode is formed in that portion of the film 51 which corresponds to the capacitor lower electrode 42.

A PZT film and a Pt film for an upper electrode are deposited in sequence by sputtering, and the surface of the third interlayer insulation film 51 is exposed by CMP, thereby leaving both the capacitor insulation film 52 and capacitor upper electrode 53 in the trench. Then, RTA is executed at a temperature of 750° C. to crystallize the PZT.

After that, a SixNy (or $TiO_2$) film 54 is deposited on the flattened surface of the third interlayer insulation film 51 as an insulation film. The SixNy film 54 serves as a barrier film against hydrogen caused in the subsequent plug burying process and protects a ferroelectric capacitor from the hydrogen.

Figure 25B:
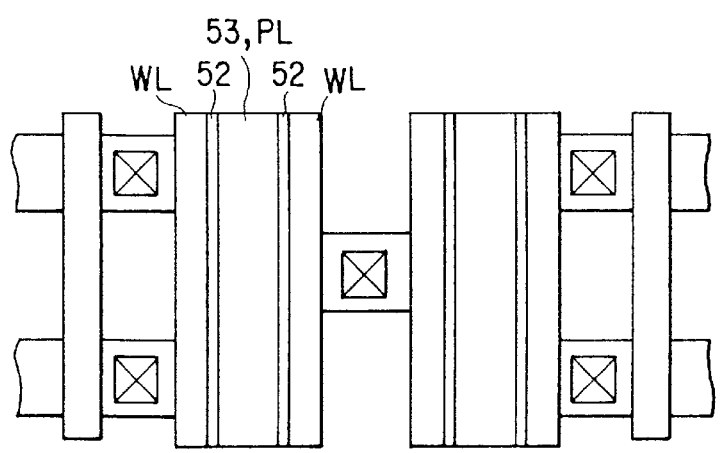
FIG. 25B is a plan view illustrating a step subsequent to that shown in FIGS. 24A and 24B.

FIG. 25B is a plan view partly showing a pattern of part of the FRAM illustrated in FIG. 25A. This pattern is the same as that of FIG. 24B except for the capacitor insulation film 52 and the capacitor upper electrodes 53 added thereto.

Figure 26A:
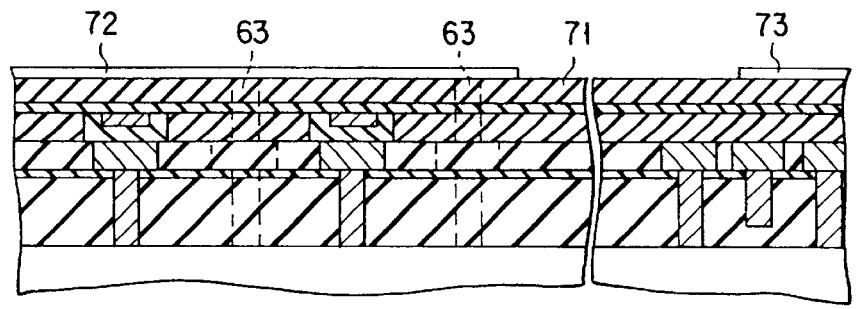
FIG. 26A is a cross-sectional view illustrating a step subsequent to that shown in FIGS. 25A and 25B.

As shown in FIG. 26A, a fourth interlayer insulation film 71 is formed on the SixNy film 54, and contact holes are formed in the insulation film 71, SixNy film 54 and third insulation film 51 so as to be located above the contact portions 42a of the first bit line contact plugs.

After TiN and TiAIN are evaporated as barrier metals, tungsten (W) is deposited and buried in the contact holes by CVD to form second bit line contact plugs 63. Then, the surface of the fourth interlayer insulation film 71 is exposed by etch back or CMP.

Aluminum for bit lines is deposited on the flattened fourth interlayer insulation film 71, and RIE is executed to form bit lines (BL) 72. A via plug (not shown) and a second wiring layer 73 in the adjacent mixed device can be formed simultaneously with the second bit line contact plugs 63 and bit lines (Al wiring) 72 in the FRAM; therefore, the number of steps of forming the wiring layer can be made smaller than in the prior art case.

Figure 26B:
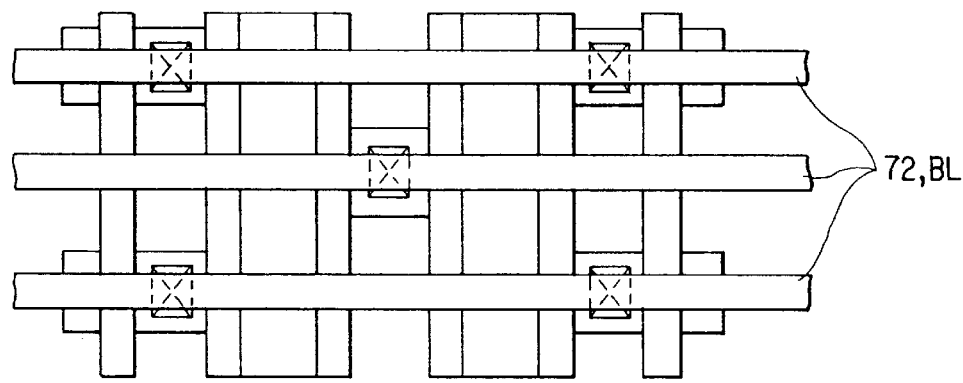
FIG. 26B is a cross-sectional view illustrating a step subsequent to that shown in FIGS. 25A and 25B.

FIG. 26B is a plan view partly perspective showing a pattern of part of the FRAM illustrated in FIG. 26A. This pattern is the same as that of FIG. 25B except for the bit lines 72 added thereto.

As above described, a shape of the ferroelectric capacitor may be changed. FIG. 42 is another cross sectional view illustrating a step subsequent to the step of FIG. 24. This cross sectional view is the same as that of FIG. 25A except that the capacitor lower electrode 42 is wider than the ferroelectric film 52. FIG. 43 is another cross-sectional view illustrating a step subsequent to the step of FIG. 42. This cross sectional view is the same as that of FIG. 26A except that the capacitor lower electrode 42 is wider than the ferroelectric film 52.

According to the example 4, since the ferroelectric capacitor and wiring layer are formed by CMP, the capacitor can be processed more easily than by conventional RIE.

Since the lower electrode of the capacitor section and the wiring layer of the adjacent device are formed at the same time, the number of manufacturing steps can be reduced and a step difference between the ferroelectric memory section and the other device is decreased. It is thus evident that wiring can easily be formed between the devices.

In the second embodiment, too, the same step as that of the second and third examples of forming a ferroelectric capacitor section in the first embodiment, can be adopted.

EXAMPLE 5

FIG. 27

Figure 27:
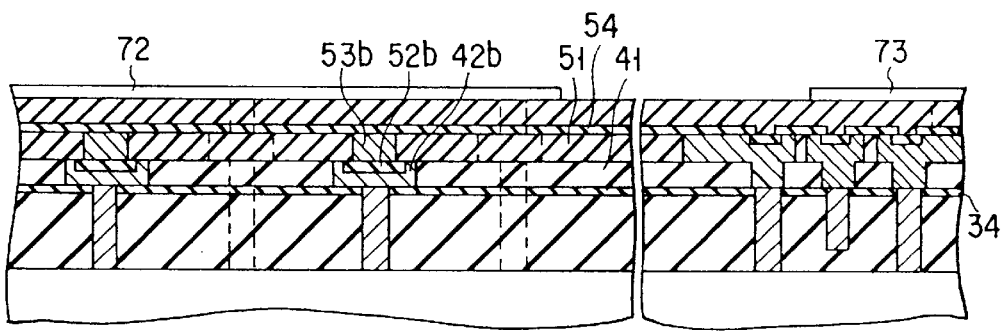
FIG. 27 is a cross-sectional view illustrating an example 5 of the step of manufacturing the LSI according to the second embodiment of the present invention.

FIG. 27 is a sectional view of the structure of a ferroelectric capacitor section of an LSI manufactured by the same process as that of example 4 except that the same step as that of the second example of forming a ferroelectric capacitor section in the first embodiment is adopted.

In FIG. 27, reference numeral 42b indicates a lower electrode; 52b, a ferroelectric film; 53b, an upper electrode; and the same reference numerals are added to the same elements as those of FIG. 26A.

EXAMPLE 6

FIG. 28

Figure 28:
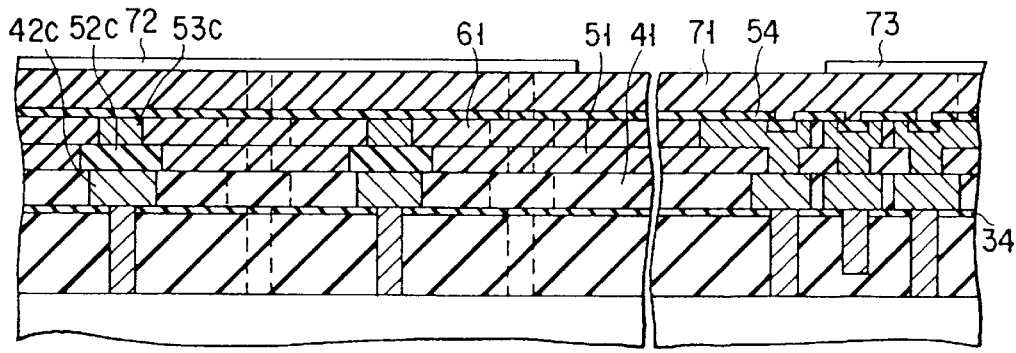
FIG. 28 is a cross-sectional view illustrating an example 6 of the step of manufacturing the LSI according to the second embodiment of the present invention.

FIG. 28 is a sectional view of the structure of a ferroelectric capacitor section of an LSI manufactured by the same process as that of example 4 except that the same step as that of the third example of forming a ferroelectric capacitor section in the first embodiment is adopted.

In FIG. 28, reference numeral 42c indicates a lower electrode; 52c, a ferroelectric film; 53c, an upper electrode; and the same reference numerals are added to the same elements as those of FIG. 26A.

As above described, a shape of the ferroelectric capacitor may be changed. FIG. 44 is another cross-sectional view illustrating an example 6 of the step of manufacturing the LSI according to the second embodiment of the present invention. This cross sectional view is the same as that of FIG. 28 except that the capacitor lower electrode 42 is wider than the ferroelectric film 52.

(Third Embodiment)

EXAMPLES 7 to 9

The third embodiment is directed to a step of manufacturing an LSI in which a bit line is formed in the same wiring layer as the upper or lower electrode of a ferroelectric capacitor. Examples 7 to 9 will now be described.

EXAMPLE 7

FIGS. 29 to 33

FIGS. 29 to 33 are cross-sectional and plan views of the structure of an LSI manufactured by the same step as that of the first example for forming a ferroelectric capacitor section in the first embodiment.

Figure 29:
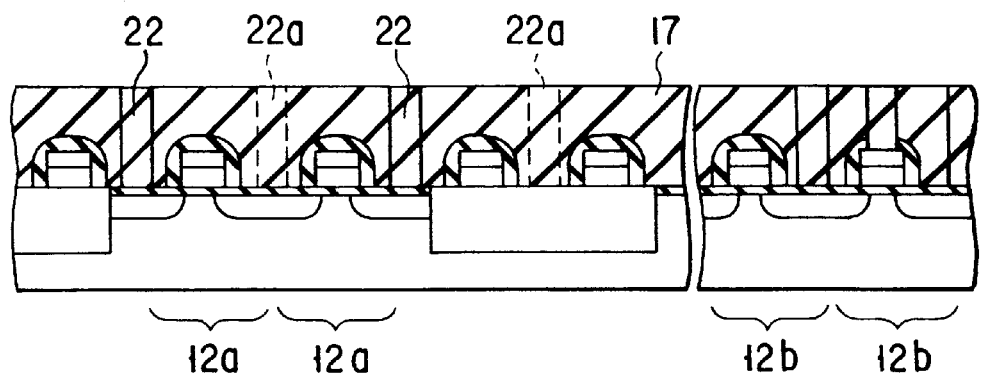
FIG. 29 is a cross-sectional view illustrating an example 7 of a step of manufacturing an LSI combining an FRAM and another device according to a third embodiment of the present invention.

First, as illustrated in FIG. 29, after a field oxide film 11, switching MOS transistors 12a and 12b, and a gate electrode protection film 15 are formed, a first interlayer insulation film 17 (e.g., BPSG) is formed and then the surface of the film 17 is flattened by CMP. After that, both a contact hole 22 for capacitor lower electrodes and another contact hole 22a for upper bit lines are formed.

Figure 30A:
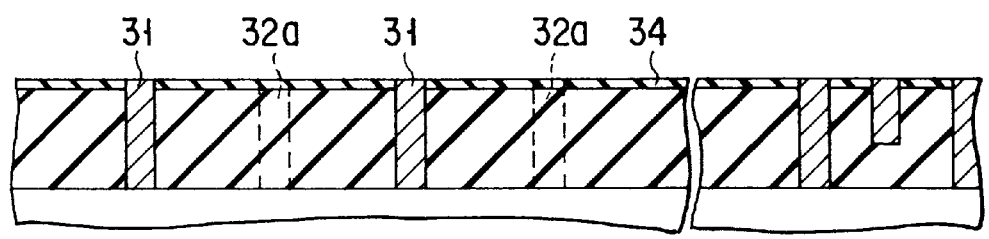
FIG. 30A is a cross-sectional view illustrating a step subsequent to that shown in FIG. 29.

As shown in FIG. 30A, Ti and TiN are evaporated as barrier metals, and then a tungsten (W) film is formed using CVD and buried into the contact holes 22 and 22a to form a capacitor contact plug 31 and a bit line contact plug 32a. After that, the surface of the first interlayer insulation film 17 is exposed by etch back or CMP.

A SixNy (or TiO$_2$) film 34 is deposited on the flattened surface of the film 17 as an insulation film. The SixNy film 34 serves as a barrier film against oxygen used in the subsequent capacitor forming step and protects an underlying transistor from the oxygen.

Figure 30B:
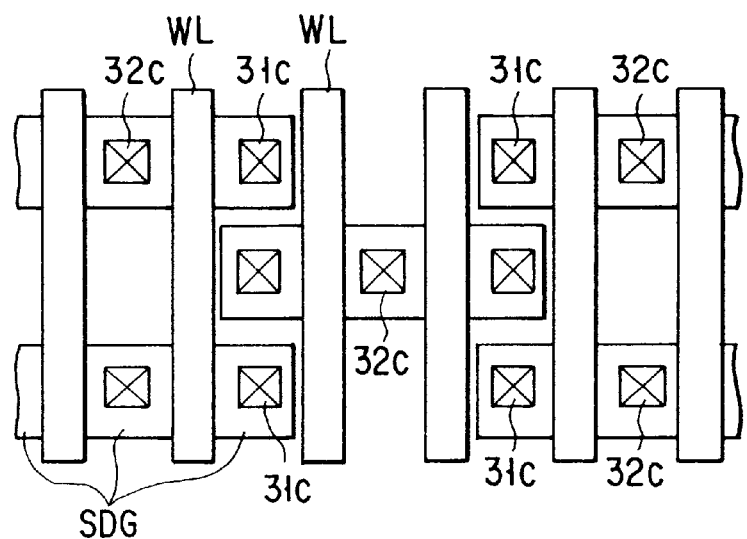
FIG. 30B is a plan view illustrating a step subsequent to that shown in FIG. 29.

FIG. 30B is a plan view partly perspective showing a pattern of part of the FRAM illustrated in FIG. 30A. In FIGS. 30A and 30B, SDG denotes source, drain and gate regions of an MOS transistor 12a, WL shows word lines, 31c indicates capacitor contact plugs, and 32c denotes bit line contact plugs.

Figure 31A:
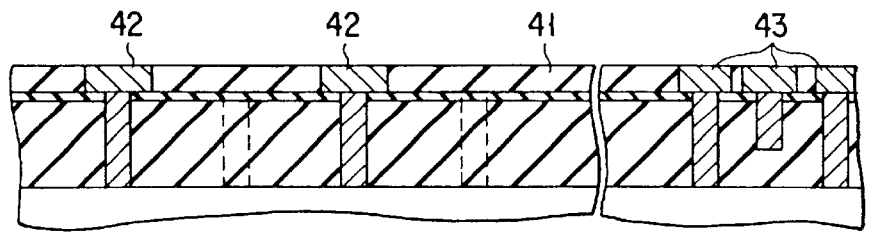
FIG. 31A is a cross-sectional view illustrating a step subsequent to that shown in FIGS. 30A and 30B.

As shown in FIG. 31A, after a second interlayer insulation film 41 is formed on the SixNy film 34, trenches (not shown) are formed in each of a capacitor lower electrode forming region and a bit line forming region. TiN or TIAlN serving as a barrier metal and Pt serving as a lower electrode film are deposited in sequence. After that, the surface of the second interlayer insulation film 41 is exposed by CMP to leave capacitor lower electrodes 42 and bit lines (not shown) in the trenches.

When the electrodes 42 are formed, a first wiring layer 43 of the adjacent mixed device can be formed. Thus, the number of steps of forming the wiring layer can be made smaller than in the prior art case.

Figure 31B:
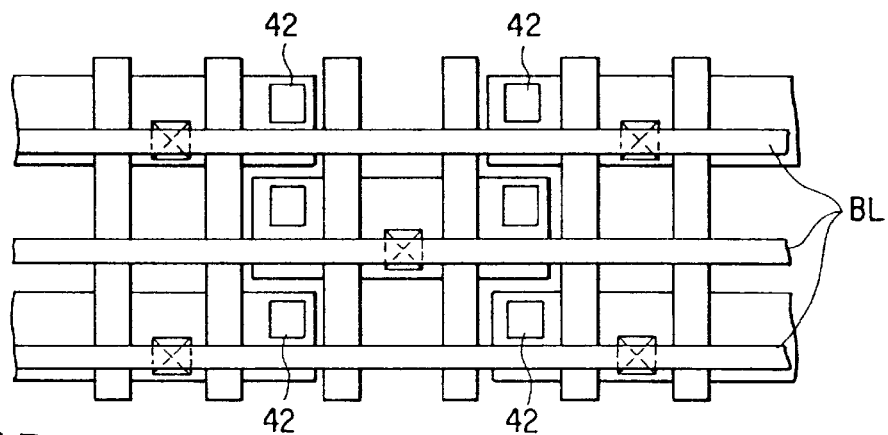
FIG. 31B is a plan view illustrating a step subsequent to that shown in FIGS. 30A and 30B.

FIG. 31B is a plan view partly showing a pattern of part of the FRAM of FIG. 31A. This pattern is the same as that of FIG. 30B except for the lower electrodes 42 and bit lines BL being added thereto.

Figure 32A:
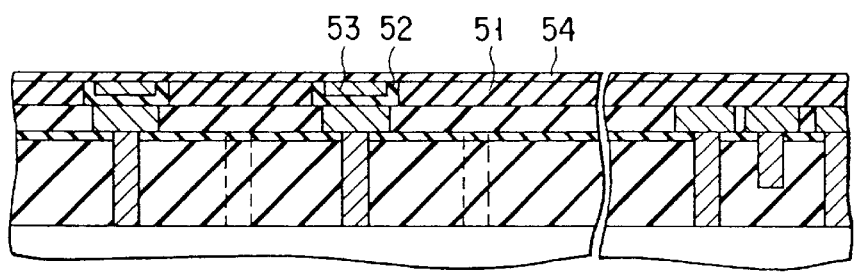
FIG. 32A is a cross-sectional view illustrating a step subsequent to that shown in FIGS. 31A and 31B.

As illustrated in FIG. 32A, a third interlayer insulation film 51 is formed on the flattened second interlayer insulation film 41. After that, a second trench for both a ferroelectric film and a capacitor upper electrode is formed in that portion of the film 51 which is located above the capacitor lower electrode 42. Then, a PZT film and a Pt film for an upper electrode are deposited in sequence by sputtering, and the surface of the third interlayer insulation film 51 is exposed by CMP, thereby leaving both the capacitor insulation film 52 and capacitor upper electrode 53 in the trench. Then, RTA is executed at a temperature of 750° C. to crystallize the PZT.

An SixNy (or TiO$_2$) film 54 excluding a hydrogen group is deposited on the flattened surface of the film 51 as an insulation film. The SixNy film 54 serves as a barrier film against hydrogen caused in the subsequent plug burying process and protects a ferroelectric capacitor from the hydrogen.

Figure 32B:
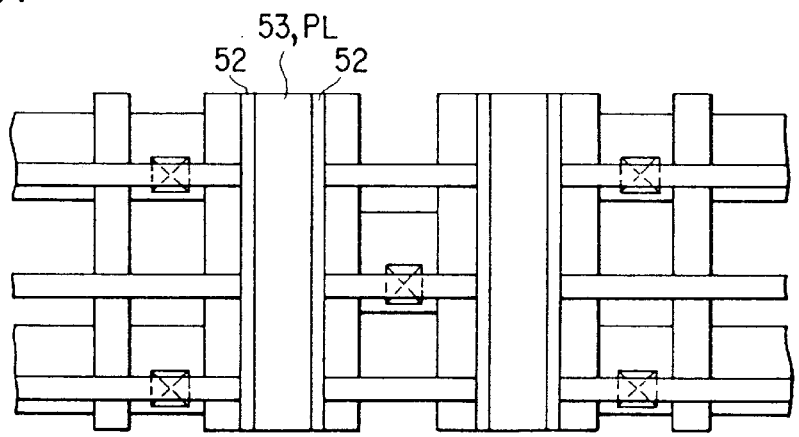
FIG. 32B is a plan view illustrating a step subsequent to that shown in FIGS. 31A and 31B.

FIG. 32B is a plan view partly perspective showing a pattern of part of the FRAM illustrated in FIG. 32A. This pattern is the same as that of FIG. 31B except for the capacitor insulation film 52 and the capacitor upper electrodes 53 (capacitor plate line PL) added thereto.

Figure 33:
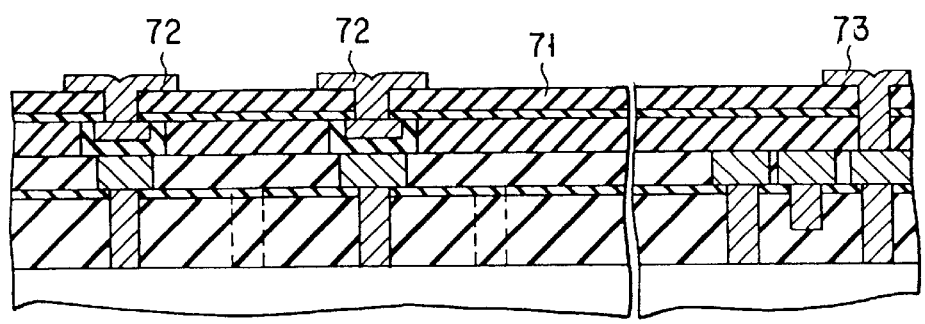
FIG. 33 is a cross-sectional view illustrating a step subsequent to that shown in FIGS. 32A and 32B.

As shown in FIG. 33, a fourth interlayer insulation film 71 is formed on the SixNy film 54 and flattened. Then, a contact hole is formed in the flattened film 71, and aluminum is deposited thereon and RIE is executed to form an upper wiring (Al wiring) layer 72.

When the Al wiring layer 72 is formed, a second wiring layer 73 can be formed in the adjacent mixed device; therefore, the number of steps of forming the wiring layer can be made smaller than in the prior art case.

Figure 45:
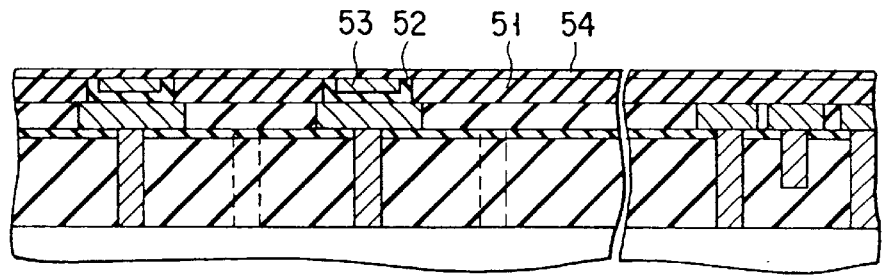
FIG. 45 is another cross-sectional view illustrating a step subsequent to the step of FIG. 31A.
Figure 46:
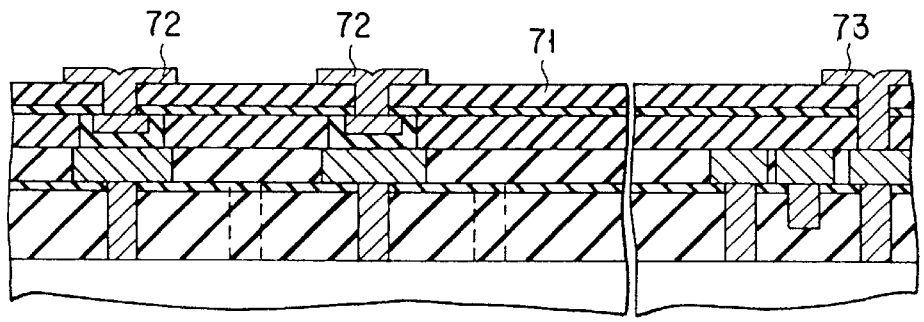
FIG. 46 is another cross-sectional view illustrating a step subsequent to the step of FIG. 45.

As above described, a shape of the ferroelectric capacitor may be changed. FIG. 45 is another cross sectional view illustrating a step subsequent to the step of FIG. 31A. This cross sectional view is the same as that of FIG. 32A except that the capacitor lower electrode is wider than the ferroelectric film 52. FIG. 46 is another cross-sectional view illustrating a step subsequent to the step of FIG. 45. This cross sectional view is the same as that of FIG. 32A except that the capacitor lower electrode is wider than the ferroelectric film 52.

According to the example 7, since the ferroelectric capacitor and wiring layer are formed by CMP, the capacitor can be processed more easily than by conventional RIE.

Since the lower electrode of the capacitor section and the wiring layer of the adjacent device are formed at the same time, the number of manufacturing steps can be reduced and a step difference between the ferroelectric memory section and the other device is decreased. It is thus evident that the adjacent devices can be flattened and fine wiring can easily be formed.

EXAMPLE 8

FIG. 34

Figure 34:
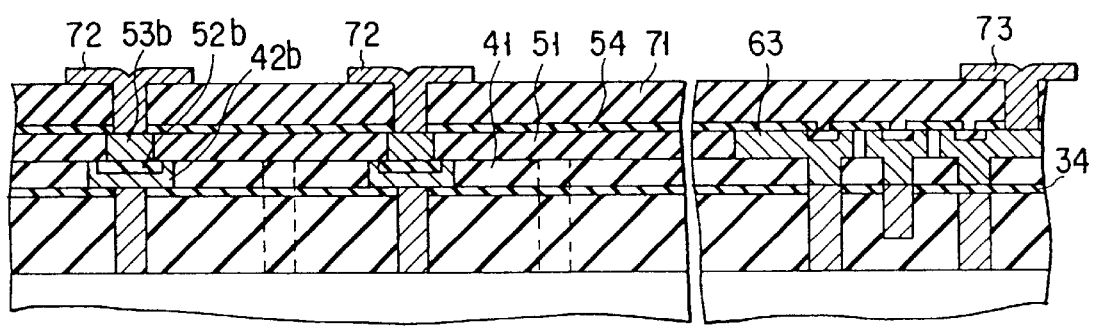
FIG. 34 is a cross-sectional view illustrating an example 8 of the step of manufacturing an LSI according to the third embodiment of the present invention.

FIG. 34 is a sectional view of the structure of a ferroelectric capacitor section of an LSI manufactured by the same process as that of example 7 except that the same step as that of the second example for forming a ferroelectric capacitor section in the first embodiment is adopted.

In FIG. 34, reference numeral 42b indicates a lower electrode; 52b, a ferroelectric film; 53b, an upper electrode; and the same reference numerals are added to the same elements as those of FIG. 33. In the second embodiment, the bit lines are formed at the same time when the upper electrodes 53b are done.

EXAMPLE 9

FIG. 35

Figure 35:
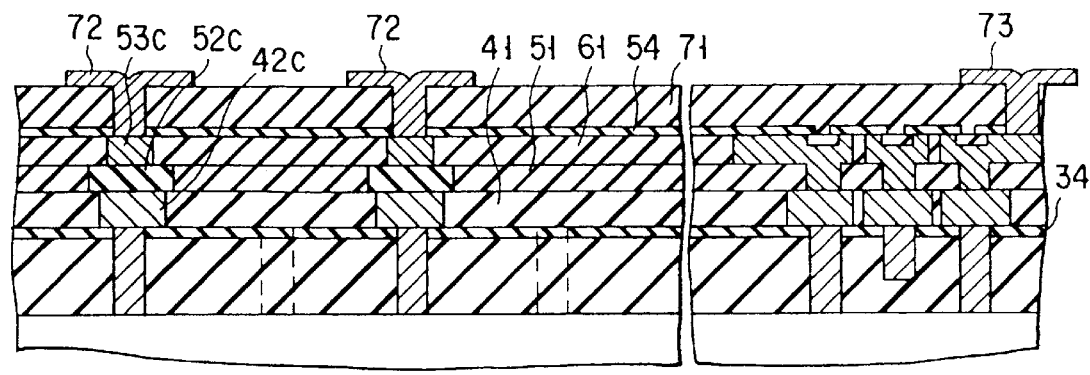
FIG. 35 is a cross-sectional view illustrating an example 9 of the step of manufacturing the LSI according to the third embodiment of the present invention.

FIG. 35 is a sectional view of the structure of a ferroelectric capacitor section of an LSI manufactured by the same process as that of example 7 except that the same step as that of the third example for forming a ferroelectric capacitor section in the first embodiment is adopted.

In FIG. 35, reference numeral 42c indicates a lower electrode; 52c, a ferroelectric film; 53c, an upper electrode; and the same reference numerals are added to the same elements as those of FIG. 33. In the third embodiment, the bit lines are formed at the same time when the lower electrode 42c is done.

In the first to third embodiments, if a contact plug is formed by burying tungsten (W) by CVD without using the SixNy (TiO$_2$) film shown in examples 1 to 9, a capacitor using a ferroelectric film is degraded by hydrogen caused in the process.

To prevent this, the contact plug can be, formed by Al reflow in place of burying tungsten (W) by CVD. The Al reflow is a method of depositing aluminum by radio frequency magnetron sputtering by setting the temperature of the substrate at 400° C. to 470° C. in the argon (Ar) atmosphere or a method of resolving aluminum at a high temperature and migrationally burying it in a via. Since, in this method, no hydrogen is included in the process, a ferroelectric capacitor film is not damaged so seriously.

In the examples 1 to 9, platinum (Pt) is adopted as a material for the upper and lower electrodes of the ferroelectric capacitor. The reason therefor is that platinum is a refractory metal and not oxidized and thus its ferroelectric characteristic is suitable for the ferroelectric capacitor.

As for materials of the ferroelectric capacitor, there are Ir, IrOx, Ru, RuOx, Re, ReOx, SrRuO$_3$ and precious metal or conductive oxide such as their compounds.

The resistivity of Pt is 9.81 Ωm (that of Ir is 4.81 Ωm) which is four to six times as high as that (2.50 Ωm) of Al used in the conventional LSI device and that (1.55 Ωm) of Cu under consideration of practicality. In other words, if the wiring of the mixed device is formed by Pt or Ir conventionally used in the electrodes of a ferroelectric capacitor, the wiring resistance is increased to restrict a high-speed operation of the devices. It can thus be thought to employ low-resistance materials such as Al and Cu in the electrodes of the capacitor.

Since, however, heat treatment of at least 600° C. or higher is required in order to form the ferroelectric capacitor, an element having a melting point of not higher than this temperature is not suitable for the present invention, because melting is caused when the ferroelectric capacitor is formed. As low-resistance materials having a melting point of 600° C. or higher required for crystallizing the ferroelectric film, there are Cu (melting point=1085° C.), W (melting point=3387° C.) and Mo (melting point=2610° C.). Since, however, the upper electrode of the ferroelectric capacitor is formed after the ferroelectric film is done, Al as well as Cu, W and Mo can be used. It is to be noted that the Cu, W and Mo can be used as wiring material.

For the electrode contacting the ferroelectric film, Pt which is not oxidized or Ir, IrOx, Ru, RuOx, Re, ReOx and SrRuO$_3$ which are oxidized but low in resistance, and their compounds are suitable. The following low-resistance structure is suitable for the electrodes.

More specifically, in order to form low-resistance wiring using electrode materials for the ferroelectric capacitor, Cu/Ti/TiN/Pt can be used as the upper electrode, PZT can be used as the ferroelectric film, and Pt/TiN/Ti/Cu can be used as the lower electrode. Ti/TiN is a barrier metal against oxidation of Cu electrodes.

A layered structure of low-resistance metal (Cu, W, Mo, Rh, etc.)/barrier metal (Ti/TiN, W/WN, TiAlN, TiN, WN, etc.)/precious metal (Pt, Ir, Ru, Re, Sr and their oxides or a compound containing at least one of them) can be used as the upper electrode, and a layered structure of precious metal (Pt, Ir, Ru, Re and their oxides or a compound containing at least one of them)/barrier metal (Ti/TiN, W/WN, TiAlN, TiN, WN, etc.)/low-resistance and refractory metal (Al, Cu, W, Mo, Rh, etc.) can be used as the lower electrode.

If the above-described electrode structures are adopted, the wiring using electrode materials of the ferroelectric capacitor can be decreased in resistance, and the restriction of high-speed characteristics of the devices can be avoided.

Figure 47:
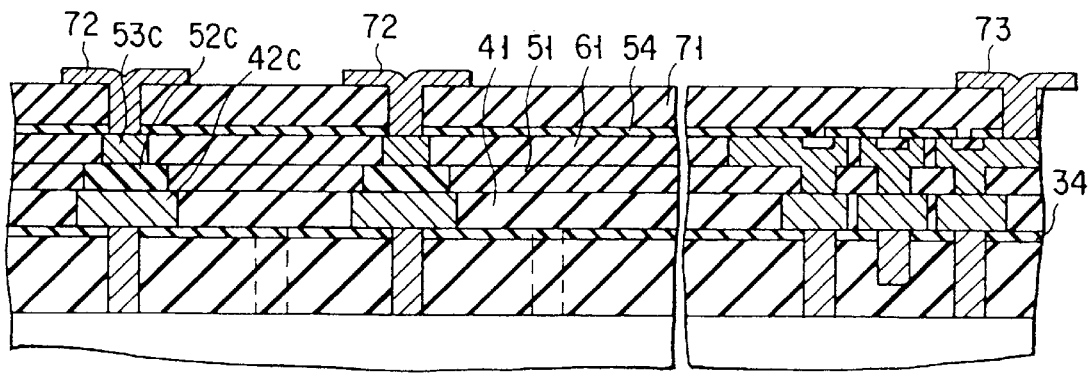
FIG. 47 is another cross-sectional view illustrating an example 9 of the step of manufacturing the LSI according to the third embodiment of the present invention.

As above described, a shape of the ferroelectric capacitor may be changed. FIG. 47 is another cross-sectional view illustrating an example 9 of the step of manufacturing the LSI according to the third embodiment of the present invention. This cross sectional view is the same as that of FIG. 35 except that the capacitor lower electrode is wider than the ferroelectric film 52.

Furthermore, an oxide having a perovskite structure of PUT (Pb$_{1-y}$ La$_y$ Zr$_{1-x}$ TixO$_3$), BIT (Bi$_4$ Ti$_3$ O$_{12}$) and the like as well as PZT, or an oxide can be substituted for some of these elements, and a bismuth layered compound such as a strontium/bismuth/tantalum oxide (SBT: SrBi$_2$Ta$_2$O$_9$) can be used for the ferroelectric capacitor.

In the foregoing embodiments of the present invention, the ferroelectric capacitor is formed by CMP. However, it can be formed by etching for flattening such as etch back.

As described above, the present invention provides a semiconductor integrated circuit having a structure which facilitates a high degree of integration and mixture of devices and which allows the electrodes to be easily processed to prevent the ferroelectric capacitor from being damaged, and a method for manufacturing the same.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method for manufacturing a semiconductor integrated circuit, comprising:

forming a first insulating film on a semiconductor substrate, said first insulating film having a flattened surface;

forming a first groove in said first insulating film;

depositing a first electrode film on said first insulating film, and flattening a surface of said first electrode film, thereby forming a first electrode in said first groove;

depositing a second insulating film on said first electrode and said first insulating film;

forming a second groove in a portion of said second insulating film which is located above said first electrode film;

depositing a ferroelectric film in said second groove, and flattening a surface of said ferroelectric film;

depositing a third insulating film on said ferroelectric film and said second insulating film;

forming a third groove in a portion of said third insulating film which is located above said ferroelectric film; and depositing a second electrode film in said third groove, and flattening a surface of said second electrode film, thereby forming a second electrode in said third groove, wherein said first electrode, said ferroelectric film and said second electrode comprise a ferroelectric capacitor of a ferroelectric memory.

2. The method according to claim 1, wherein one of said forming said first electrode and said forming said second electrode includes forming wiring of another device.

3. The method according to claim 1, further comprising:
forming a fourth insulating film on said semiconductor substrate before forming said first insulating film;
forming a groove in said fourth insulating film; and
forming bit lines in said groove formed in said fourth insulating film.

4. The method according to claim 1, further comprising:
forming a fourth insulating film on said third insulating film and said second electrode, after forming said second electrode; and
forming bit lines on said fourth insulating film.

5. The method according to claim 1, wherein one of said forming said first insulating film and said forming said second electrode includes forming bit lines of said ferroelectric memory.

* * * * *